(12) United States Patent
He et al.

(10) Patent No.: US 10,862,442 B2
(45) Date of Patent: Dec. 8, 2020

(54) LOW POWER DISSIPATION HIGH PERFORMANCE CLASS-D AMPLIFIER

(71) Applicant: Cirrus Logic International Semiconductor Ltd., Edinburgh (GB)

(72) Inventors: Zhaohui He, Austin, TX (US); Rahul Singh, Austin, TX (US); Ruoxin Jiang, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 141 days.

(21) Appl. No.: 16/184,909

(22) Filed: Nov. 8, 2018

(65) Prior Publication Data

US 2019/0149107 A1 May 16, 2019

Related U.S. Application Data

(63) Continuation of application No. 16/184,511, filed on Nov. 8, 2018.
(Continued)

(51) Int. Cl.
*H03F 3/21* (2006.01)
*H03F 3/217* (2006.01)
(Continued)

(52) U.S. Cl.
CPC ......... *H03F 3/2171* (2013.01); *H03F 1/0205* (2013.01); *H03F 1/0211* (2013.01); *H03F 1/3205* (2013.01); *H03F 1/3211* (2013.01); *H03F 3/187* (2013.01); *H03F 3/2173* (2013.01); *H03F 3/45215* (2013.01); *H03F 3/45475* (2013.01); *H03F 3/45672* (2013.01); *H03F 2200/03* (2013.01); *H03F 2200/129* (2013.01); *H03F 2200/135* (2013.01); *H03F 2200/264* (2013.01); *H03F 2200/267* (2013.01);
(Continued)

(58) Field of Classification Search
CPC .................................................. H03F 3/2171
See application file for complete search history.

(56) References Cited

U.S. PATENT DOCUMENTS

| | | | | |
|---|---|---|---|---|
| 5,805,020 A | * | 9/1998 | Danz | H03F 3/2171 330/10 |
| 6,373,334 B1 | * | 4/2002 | Melanson | H03F 3/2175 330/10 |

(Continued)

*Primary Examiner* — Patricia T Nguyen
(74) *Attorney, Agent, or Firm* — E. Alan Davis; James W. Huffman

(57) ABSTRACT

In a Class-D amplifier, first/second ratios and first/second RC time constants are sequentially matched by trimming. An integrator is coupled to differential first/second paths. The first/second ratios are of a feedback resistor to an input resistor in the first/second paths. R's of the first/second RC time constants are the resistors of the first/second matched ratios. C's of the first/second RC time constants are integrating capacitors in the first/second path. For each of multiple power rails, a ramp amplitude is determined based on a sensed voltage. Concurrently, the driver stage is switched from first to second power rails and quantizer switched from first to second ramp amplitudes to achieve constant combined quantizer/driver stage gain. Based on a sensed load current, an IR drop is determined for a respective output impedance of the driver stage and added to a loop filter output to compensate for the respective output impedance.

14 Claims, 15 Drawing Sheets

Related U.S. Application Data

(60) Provisional application No. 62/584,351, filed on Nov. 10, 2017.

(51) Int. Cl.
    *H03F 3/45*     (2006.01)
    *H03F 3/187*     (2006.01)
    *H03F 1/02*     (2006.01)
    *H03F 1/32*     (2006.01)

(52) U.S. Cl.
    CPC .. *H03F 2200/351* (2013.01); *H03F 2200/462* (2013.01); *H03F 2200/471* (2013.01); *H03F 2203/45116* (2013.01); *H03F 2203/45512* (2013.01); *H03F 2203/45528* (2013.01)

(56) References Cited

U.S. PATENT DOCUMENTS

| | | |
|---|---|---|
| 6,593,807 B2 | 7/2003 | Groves, Jr. et al. |
| 7,330,069 B2 | 2/2008 | Yamamura et al. |
| 8,451,057 B2 | 5/2013 | Hsieh |
| 2009/0160547 A1* | 6/2009 | Shankar .................. H03F 3/217 330/10 |
| 2013/0127530 A1 | 5/2013 | Ni et al. |
| 2013/0223652 A1* | 8/2013 | Sahandiesfanjani ......................... H03F 3/2175 381/121 |
| 2015/0249888 A1* | 9/2015 | Bogdanov ............... H03F 3/181 381/98 |
| 2016/0056771 A1* | 2/2016 | Ibusuki ................. H03F 3/2171 381/123 |
| 2018/0097490 A1* | 4/2018 | Mengad .............. H03F 3/45475 |
| 2018/0234062 A1* | 8/2018 | Ramorini .............. H03K 4/066 |
| 2019/0149101 A1 | 5/2019 | He et al. |

\* cited by examiner

LOW POWER DISSIPATION HIGH PERFORMANCE CLASS-D AMPLIFIER

CROSS REFERENCE TO RELATED APPLICATION(S)

This application is a continuation of U.S. Non-Provisional application Ser. No. 16/184,511, filed Nov. 8, 2018, and which is hereby incorporated by reference in its entirety. This application claims priority based on U.S. Provisional Application, Ser. No. 62/584,351, filed Nov. 10, 2017, entitled DUAL CLASS-D OUTPUT STAGE ACHIEVING LOW POWER DISSIPATION WITHOUT PERFORMANCE DEGRADATION, which is hereby incorporated by reference in its entirety.

BACKGROUND

Reducing power dissipation of an audio amplifier is highly desirable, particularly for devices having limited battery volume as a system restriction, e.g., portable devices. In the past, various solutions have been introduced to help lower power dissipation of an audio amplifier, both on a system level or at a circuit level. Examples of prior solutions have included the following. First, a Class-D output stage is used to replace a Class-AB output stage to improve mid- to high-power efficiency by reducing output stage IR drop loss. Second, a Class-DG or Class-H power amplifier is introduced to provide just enough power supply to a Class-D output stage, such that switching capacitor loss of the Class-D output stage is minimized, and thus low-power efficiency is improved. Third, a linear amplifier is later introduced to drive speaker load at idle state, in which switching loss of a Class-D amplifier is totally removed and idle power efficiency is improved. Fourth, driver field effect transistor (FET) segmentation is utilized to further reduce switching capacitor loss for idle- to low-power efficiency by reducing the amount of moving parts in the driver FET. Fifth, lower switching frequency in the idle state is utilized to reduce switching loss. Sixth, dynamic biasing is made dependent on output power level to reduce circuit quiescent power. Seventh, noise gating is employed to shut down a Class-D amplifier if output power level is below a threshold.

Recent pursuit in some user applications is to not engage noise gating but to leave the amplifier full-throttle under the idle state so intermittent white background noise and/or any other noticeable performance differences (e.g., bi-modal Idle Channel Noise (ICN) and Total Harmonic Distortion plus Noise (THDN)) may be avoided. Another round of loss reduction for idle-low-power operation is thus required relative to the existing state-of-the-art solution, in which total chip power dissipation is targeted to be reduced by approximately half.

SUMMARY

In one embodiment, the present disclosure provides a method for improving a broadband common-mode-rejection-ratio (CMRR) in a Class-D amplifier. The method includes matching first and second ratios in a first trimming manner and matching first and second RC time constants in a second trimming manner, after matching the first and second ratios in the first trimming manner. The Class-D amplifier includes an integrator coupled to differential first and second paths. The first ratio is of a feedback resistor to an input resistor in the first path. The second ratio is of a feedback resistor to an input resistor in the second path. An R of the first RC time constant is the resistors of the first matched ratio and a C of the first RC time constant is an integrating capacitor in the first path. Another R of the second RC time constant is the resistors of the second matched ratio and another C of the second RC time constant is an integrating capacitor in the second path.

In another embodiment, the present disclosure provides a Class-D amplifier that includes an integrator coupled to differential first and second paths. The first and second paths each includes a feedback resistor, an input resistor, and an integrating capacitor. A first ratio is of the feedback resistor to the input resistor in the first path, and a second ratio is of the feedback resistor to the input resistor in the second path. The first and second ratios are matchable in a first trimming manner. An R of a first RC time constant is the resistors of the first matched ratio and a C of the first RC time constant is the integrating capacitor in the first path, and another R of a second RC time constant is the resistors of the second matched ratio and another C of the second RC time constant is the integrating capacitor in the second path. The first and second RC time constants are matchable in a second trimming manner.

In yet another embodiment, the present disclosure provides a method performed by a Class-D amplifier having a quantizer and a driver stage. The quantizer and the driver stage have a combined gain. The method includes for each power rail of a plurality of power rails of the Class-D amplifier: sensing a voltage value for the power rail and determining a ramp amplitude based on the sensed voltage value. The method also includes concurrently: switching from the driver stage using a first power rail to a second power rail of the plurality of power rails and switching from the quantizer using the ramp amplitude associated with the first power rail to using the ramp amplitude associated with the second power rail so that the combined gain is constant.

In yet another embodiment, the present disclosure provides a method for reducing distortion in a Class-D amplifier that has a driver stage operable in a plurality of modes having different respective output impedances. The method includes sensing a current at a load of the Class-D amplifier. The method also includes determining, based on the sensed current, an IR drop for a respective output impedance of the driver stage. The method also includes adding the IR drop to a loop filter output of the Class-D amplifier to compensate for the respective output impedance of the driver stage.

A first embodiment of the present disclosure is a method and system for providing a high performance, low power dissipation mode for a Class-D amplifier. For the Class-D amplifier, multi-rail output stages and the respective pre-drivers for the output stages from different level power supply voltages are interconnected together with bypass switches. The bypass switches are controlled in a manner so that a load of the Class-D amplifier is powered from only one of the different level power supply voltages. This single and only one of the different level power supply voltages is selected based on a target output power level of the Class-D amplifier.

A second embodiment of the present disclosure is a method and system for reducing distortion in a Class-D amplifier that has an output stage that may vary in an output impedance. A current is sensed at a load of the Class-D amplifier. Based on the sensed current, an IR drop is determined across the output stage for a respective output impedance. The IR drop is added to a loop filter output of the Class-D amplifier to compensate for the respective output impedance of the output stage. Furthermore, based on the sensed current, a location of a load current zero crossing is determined and the output impedance is allowed to vary at the location of the load current zero crossing. Alternatively, a location of a load voltage zero crossing is determined, and the output impedance is allowed to vary at the location of the load voltage zero crossing.

A third embodiment is a method and system for improving a broadband common-mode-rejection-ratio (CMRR) in a Class-D amplifier. A high-precision trim is used to match a ratio of a feedback resistor to an input resistor between a first pair of differential paths. The high-precision trim is used to match an RC time-constant between a second pair of differential paths around a first integrator in which an R of the RC time constant is the total resistance of the feedback resistor in parallel with the input resistor and a C of the RC time constant is the associated integrating capacitor of the first integrator.

A fourth embodiment is a method and system for providing a glitch free transition among power rails for a Class-D amplifier so that an output stage for the Class-D amplifier has a constant gain. A voltage value for each of the power rails is sensed, preferably in parallel or simultaneously. Based on the sensed voltage value for each of the power rails, a respective ramp amplitude for each of the power rails is determined. Based on the power rail being utilized by the output stage, the respective ramp amplitude is used so that a gain of the output stage is constant.

The first embodiment may improve system power efficiency around idle and low output power levels by reducing power dissipation both of internal circuits and loss associated with the total output capacitors (e.g., parasitic capacitance and external electromagnetic interference (EMI) capacitors). The second, third, and fourth embodiments may retain circuit performance (i.e., THDN, pop-click, etc.) in order to scope out an overall practical Class-D audio amplifier that can achieve low noise, low distortion and best in class power efficiency covering 0-100% output power range.

DETAILED DESCRIPTION

Figure 1A:
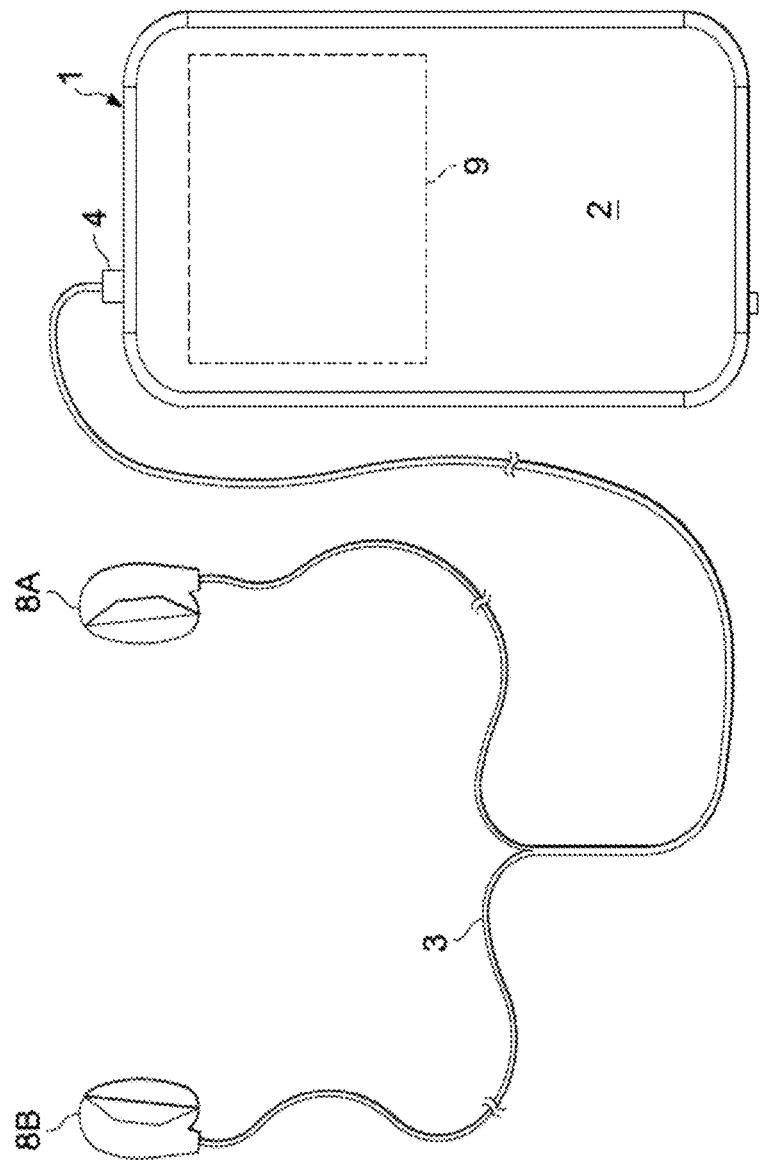
FIG. 1A is an illustration of an example personal audio device.

Referring now to FIG. 1A, an illustration of an example personal audio device 1, in accordance with embodiments of the present disclosure is shown. FIG. 1A depicts personal audio device 1 coupled to a headset 3 in the form of a pair of earbud speakers 8A and 8B. Headset 3 depicted in FIG. 1A is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1A, personal audio device 1 may include an audio integrated circuit (IC) 9 for generating an analog audio signal for transmission to headset 3 and/or another audio transducer (e.g., a loudspeaker). Embodiments of a Class-D amplifier having multiple independently selectable load-driving output stages to accomplish reduced power consumption and methods and circuits for retaining high audio performance when transitioning power supply operating modes between the multiple independent output stages are described. Although embodiments are described in the context of a personal audio device, other embodiments are contemplated for use in other audio applications.

Figure 1B:
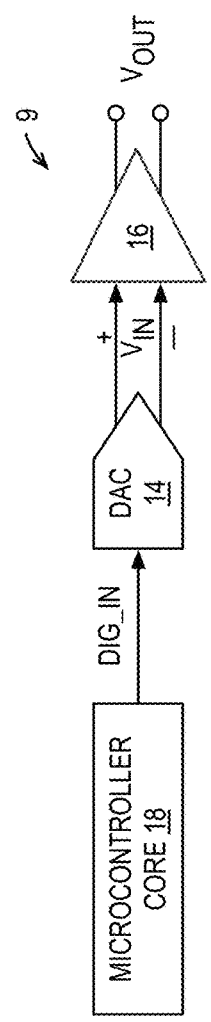
FIG. 1B is a block diagram of selected components of an example audio IC of a personal audio device.

Referring now to FIG. 1B, a block diagram of selected components of an example audio IC 9 of a personal audio device, in accordance with embodiments of the present disclosure is shown. In some embodiments, example audio IC 9 may be used to implement audio IC 9 of FIG. 1A. As shown in FIG. 1B, a microcontroller core 18 (e.g., a digital signal processor or "DSP") may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output. The microcontroller 18 may perform various functions described herein associated with the transition of power supply operating modes between multiple output stages of the amplifier 16.

Figure 2:
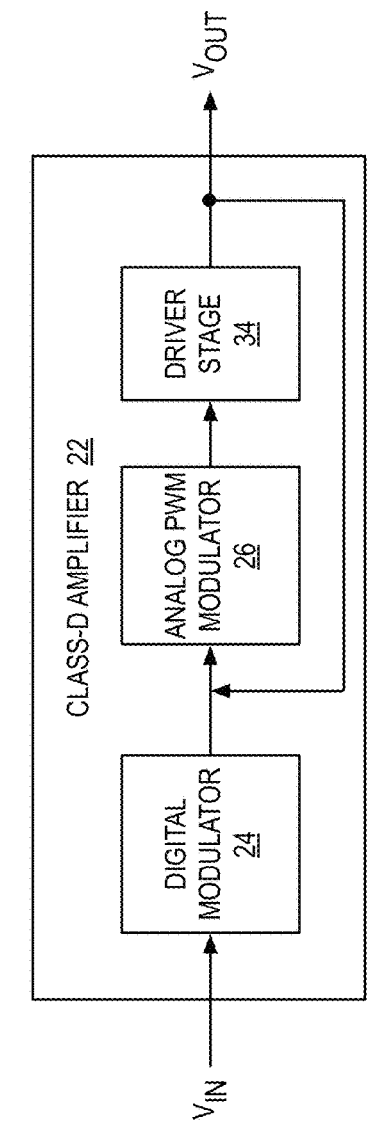
FIG. 2 is a block diagram of selected components of an example Class-D amplifier.

Referring now to FIG. 2, a block diagram of selected components of an example Class-D amplifier 22, in accordance with embodiments of the present disclosure is shown. Preferably, Class-D amplifier 22 is a pulse-width-modulation (PWM) amplifier. In some embodiments, example Class-D amplifier 22 may be used to implement amplifier 16 of FIG. 1B. As shown in FIG. 2, example Class-D amplifier 22 may include a digital modulator subsystem 24 and an analog PWM modulator 26. In one embodiment, the digital modulator subsystem 24 is a digital closed-loop PWM modulator (DCL_PWMM).

The Class-D amplifier 22 may be configured to operate in an analog closed-loop mode through the use of analog PWM modulator 26. In the analog closed-loop mode, input signal $V_{IN}$ may be modulated by digital modulator 24, analog PWM modulator 26 may receive its input from digital modulator 24, and analog PWM modulator 26 may be utilized such that the output of analog PWM modulator 26, as received and driven by driver stage 34, is driven as output signal $V_{OUT}$. Driver stage 34 may comprise a plurality of output switches configured to generate output signal $V_{OUT}$ from a modulated signal generated by analog PWM modulator 26. The output signal $V_{OUT}$ from the driver stage 34 is provided in a feedback loop to the input of the analog PWM modulator 26.

Embodiments of a digital input Class-D audio amplifier that incorporate various features that improve performance described herein may have a total power dissipation of ~15 mW, evenly split between digital, analog and Class-D driver. Conventionally, losses on digital and analog circuit portions are dictated by circuit scale and key circuit performance considerations (e.g., noise, THD and MIPs) which are typically optimized such that little further improvement may be made given a tight specification. On the other hand, losses on the Class-D driver are primarily driven by device properties (e.g., transistor threshold, unit FET Rdson (resistance drain-source on), FET parasitic capacitance, etc.). Thus, there is usually little room to improve efficiency if losses are attributed to the chosen device manufacturing process.

In many portable devices, for example, an audio amplifier that is able to deliver a peak of 8 Watts to an 8 Ohm load needs a 12V supply; hence, a high-voltage (HV) pre-driver is required to drive the output HV devices. In most cases, the supporting circuits that drive HV FETs may dissipate more power from an HV supply (e.g., speaker supply voltage VDD_SPK=12V) than power loss on the HV FETs themselves. A detailed example is shown in the following Table-1, in which CASE #4 depicts the lowest power loss scenario if a totally independent low voltage (LV) driver (pre-driver and output stage) is incorporated, assuming the HV driver (pre-driver and output stage) is in standby mode, embodiments of which are described below.

TABLE 1

| Output Stage Power Loss Details | | | | | |
|---|---|---|---|---|---|
| | CASE#1 CLASS-D, all HVFETS | CASE#2 CLASS-D, all HVFETS | CASE#3 CLASS-D, Y-bridge CONDITIONS | CASE#4 CLASS-D, LVFETS | CASE#5 CLASS-DAB |
| | HVN + P, weakFET VDD_SPK = 4.3 V | HVN + P, weakFET VDD_SPK = 1.8 V | HVN + LVP VDD_SPK = 1.8 V | LVFETs VDD_SPK = 1.8 V | LVFETs VDD_SPK = 1.8 V |
| HVFET_gate_limiter_4p3 (GLP = GLN = 80 uA, others = 90 uA) | 250 uA | 250 uA | 150 uA | 10 uA (HV standby) | 10 uA |
| HVFET_gate_switching_4p3 (HVP = HVN = 250 uA, others = 50 uA) | 550 uA | 550 uA | 300 uA | 0 | 0 |
| LVFET_gate_switching_1p8 | 0 | 0 | 250 uA | 550 uA | 0 |
| driver_output_switching(Coss) (inc. board Cp ~100 pF) | 630 uA | 265 uA | 265 uA | 265 uA | 0 |
| feedback resistor | 24 uA | 9.8 uA | 9.8 uA | 9.8 uA | 9.8 uA |
| CLASS-AB quiescent biasing | 0 | 0 | 0 | 0 | 1100 uA (est.) |
| I_TOTAL_4p3 | 1454 uA | 800 uA | 460 uA | 20 uA | 20 uA |
| I_TOTAL_1p8 | 0 | 275 uA | 515 uA | 825 uA | 1110 uA |
| P_TOTAL | 6252 uW | 3935 uW | 2905 uW | 1571 uW | 2084 uW |

As may be observed from Table 1, an advantageous power saving scheme, as described in embodiments of the present disclosure, has at least two, but is not limited to two, independently powered Class-D output stages, one HV output stage and one LV output stage, interconnected by a set of bypass switches between output nodes, to alternatively provide power to the speaker load according to the output power level. For another example, a third output stage independently powered from a middle voltage (MV) supply may be further introduced to fill the deliverable output power gap between the HV and LV stage. Advantageously, each independent output stage and its associated pre-driver are in the same power domain, i.e., are powered by the same supply, and all unused output stages and associated pre-drivers are turned off in order to achieve maximum (max) power saving from the associated supply domains.

Figure 3:
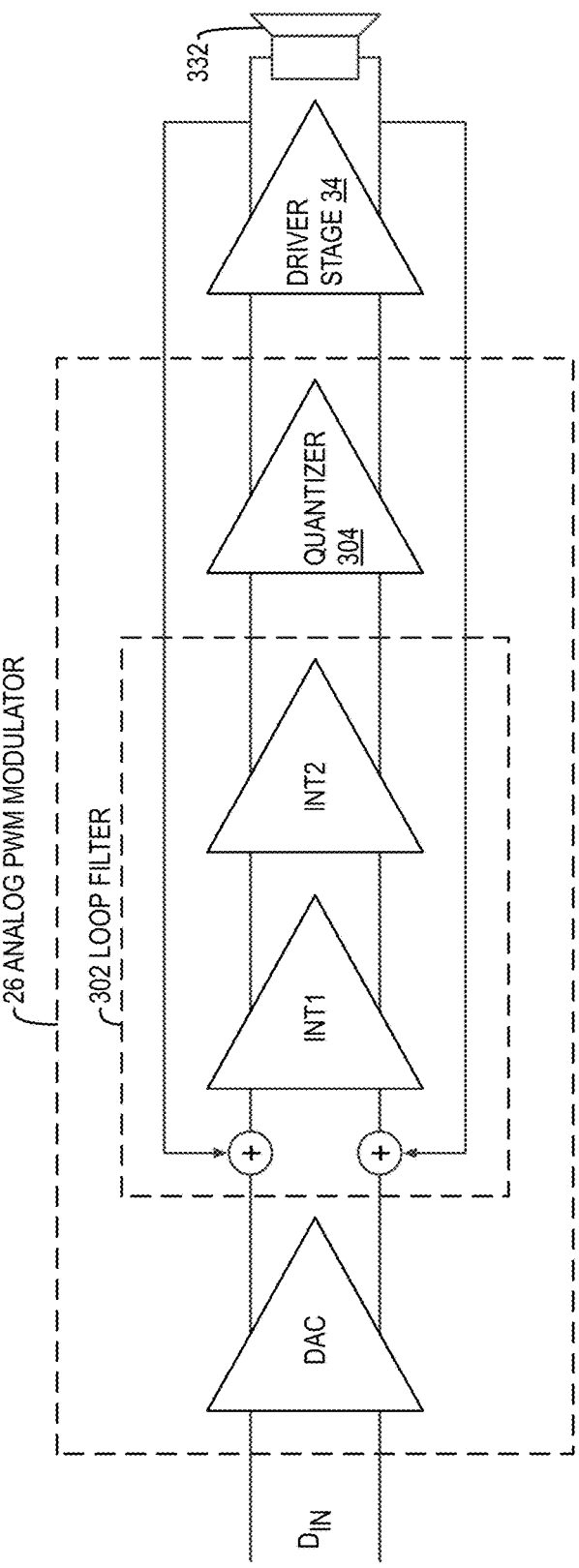
FIG. 3 is a block diagram illustrating an embodiment of portions of the Class-D amplifier of FIG. 2.

Referring now to FIG. 3, a block diagram illustrating an embodiment of portions of the Class-D amplifier 22 of FIG. 2 is shown. An analog PWM modulator 26 (e.g., of FIG. 2) receives a digital input signal $D_{IN}$ (e.g., from the digital PWM modulator 24 of FIG. 2) and provides its output to a driver stage 34 (e.g., of FIG. 2), which drives a load 332 (e.g., transducer or speaker). The analog PWM modulator 26 includes a digital-to-analog converter (DAC) that receives the digital input signal $D_{IN}$ and provides an analog differential output to a loop filter 302. In the embodiment of FIG. 3, the loop filter 302 includes a first integrator INT1 and a second integrator INT2 in series. Embodiments with different order loop filters are contemplated. The loop filter 302 passes the baseband frequency content (e.g., audio signal from 20 Hz to 20 kHz) and suppresses higher frequency content including out-of-band noise and signals around the carrier frequency (e.g., PWM switching frequency, e.g., 800 kHz) and its harmonics. The output of the loop filter 302 is provided to a quantizer 304 that compares its input signal with a ramp voltage to generate a differential PWM output that is provided to the driver stage 34. In one embodiment, the loop filter 302 in combination with the quantizer 304 may operate as a delta-sigma modulator. The driver stage 34 provides a differential output to the load 332. The differential load output is fed back to the input of the loop filter 302 and added to respective portions of the differential output of the DAC to provide a closed loop.

Figure 4:
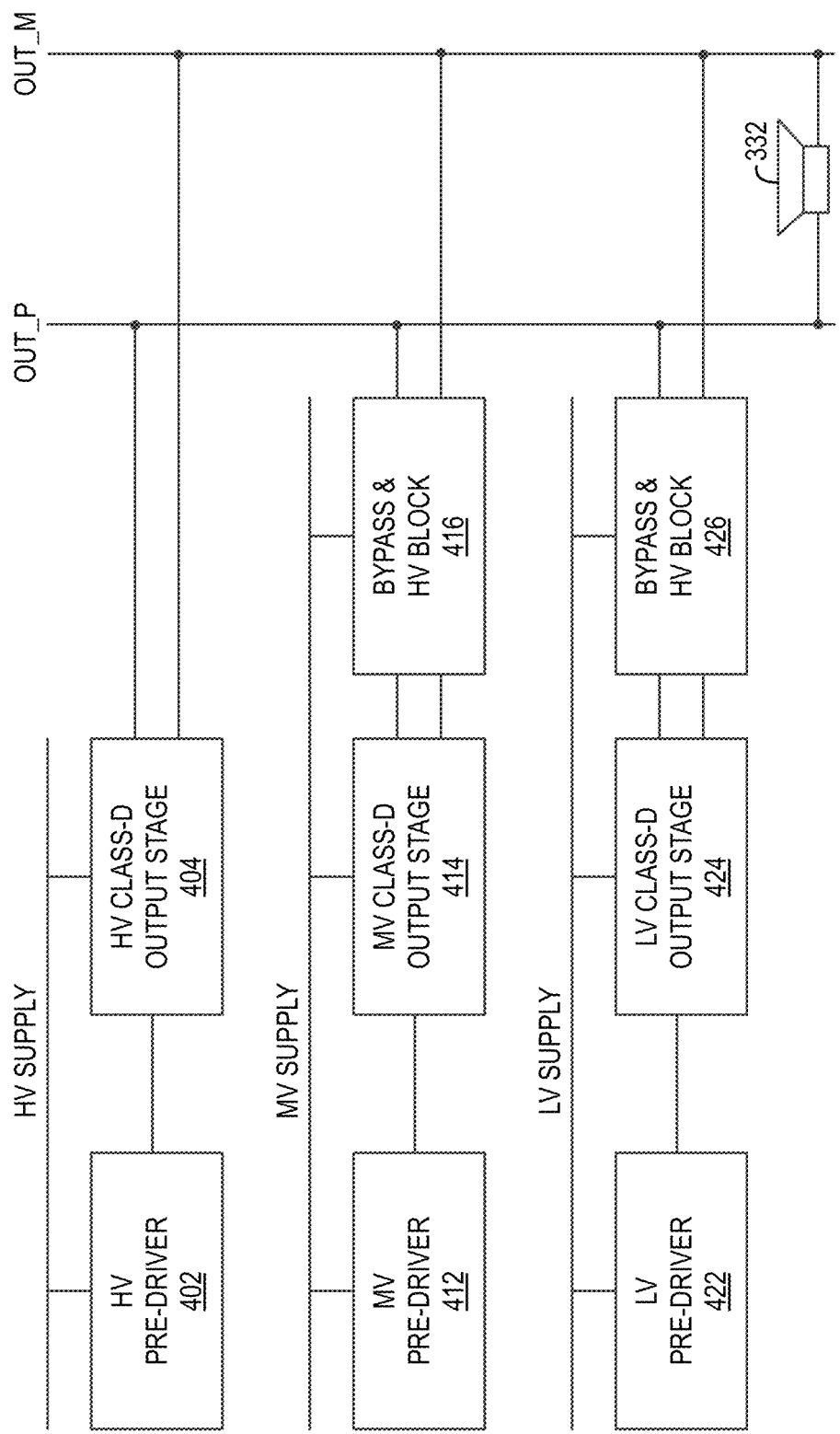
FIG. 4 is a block diagram illustrating an embodiment of a driver stage of the Class-D amplifier of FIG. 3 having multiple parallel output stages and associated pre-drivers.

Referring now to FIG. 4, a block diagram illustrating an embodiment of driver stage 34 of the Class-D amplifier 22 of FIG. 3 having multiple parallel output stages and associated pre-drivers is shown. The driver stage 34 receives three different power supply voltages: HV_SUPPLY (e.g., 12V from boost converter), MV_SUPPLY (e.g., 4.3V from battery), and LV_SUPPLY (e.g., 1.8V buck converter). The HV_SUPPLY is provided to a HV pre-driver 402 and to a HV Class-D output stage 404, which is driven by the HV pre-driver 402. The MV_SUPPLY is provided to a MV pre-driver 412 and to a MV Class-D output stage 414, which is driven by the MV pre-driver 412, and to a bypass and HV block circuit 416, which is coupled to the MV Class-D output stage 414. The LV_SUPPLY is provided to a LV pre-driver 422 and to a LV Class-D output stage 424, which is driven by the LV pre-driver 422, and to a bypass and HV block circuit 426, which is coupled to the LV Class-D output stage 424. Each of the HV Class-D output stage 404, the MV Class-D output stage 414, and the LV Class-D output stage 424 generate a differential output signal to drive the load 332 whose terminals are coupled to respective nodes OUT_M and OUT_P. As described in more detail below, control logic monitors the output power level. Based on the output power level, the control logic controls the bypass and HV block circuits 416/426 to cause one of the pre-driver/output stage pairs (HV 402/404, MV 412/414, or LV 422/424) to power the load 332, and the control logic turns off the other pre-driver/output stage pairs (HV 402/404, MV 412/414, and/or LV 422/424).

Power saving of the embodiment of FIG. 4 may be attributed to many factors beyond the quiescent current cutoff for the unused HV output stage from HV supply. Another significant power saving is on the switching loss of parasitic capacitors (caps) around the output stage, including the total output capacitance Coss of output transistors, stray capacitance on the printed circuit board (PCB), the total input capacitance Ciss of output transistors, and all parasitic capacitance that is toggling at a PWM frequency inside the pre-driver. Additionally, in some particular applications in which an EMI capacitor must be placed at both driver output nodes (e.g., OUT_P and OUT_M), a large power loss may be observed on the EMI capacitors (e.g., nano-Farad) while they are switching between HV supply and ground. However, this type of loss is significantly reduced with the introduction of a LV output stage. For example, total 2 nF capacitor flipping at 400 KHz will dissipate:

$1.2^2 * 400K * 2n = 1.152$ mW@1.2V, and $4.3^2 * 400K * 2n = 14.792$ mW@4.3V, and $12^2 * 400K * 2n = 115.2$ mW@12V.

As may be observed, larger separation between HV and LV supplies will lead to more power saving at idle/low power state on LV supply compared to the same type of losses on HV supply.

Figure 5:
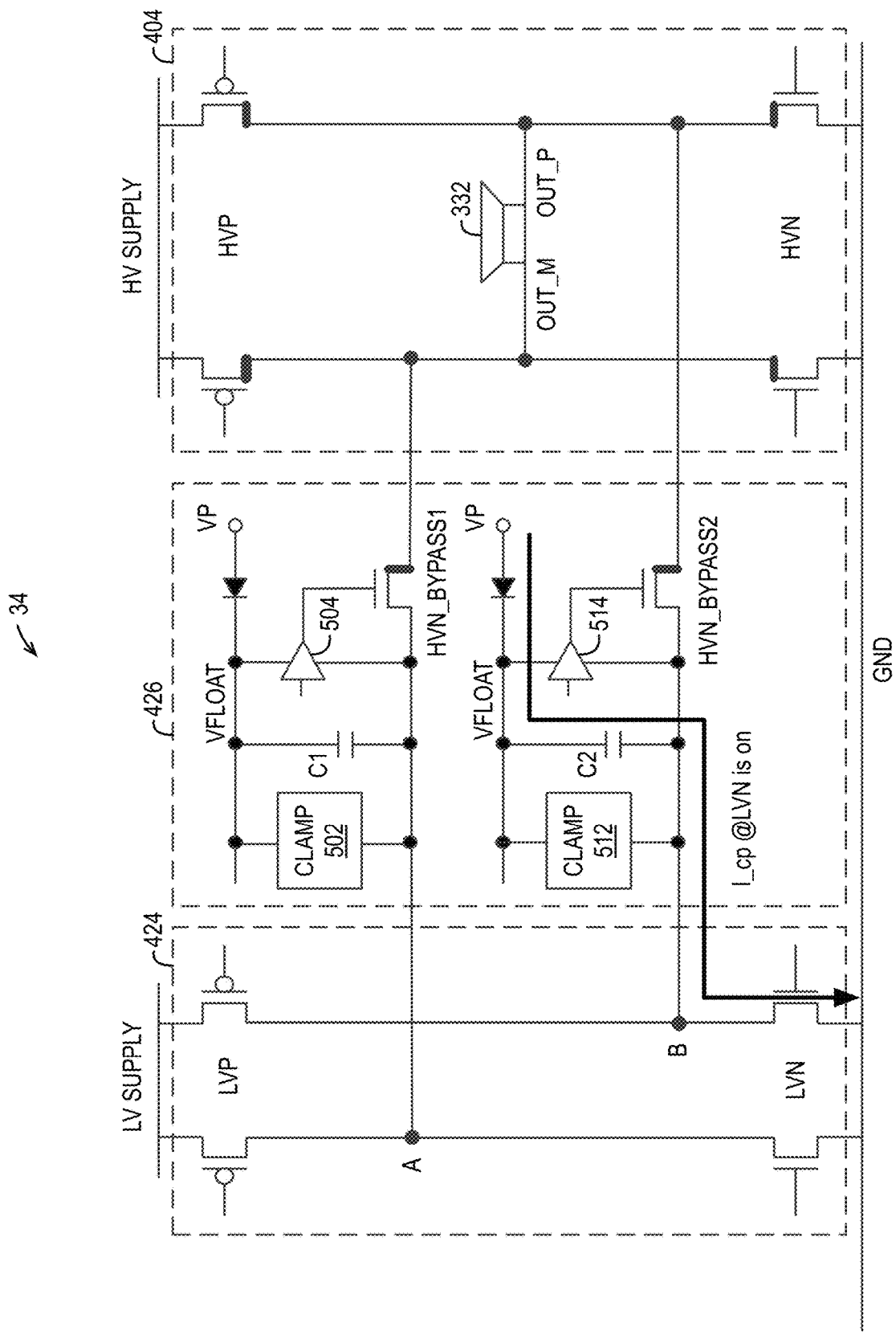
FIG. 5 is a circuit diagram illustrating an embodiment of the driver stage of FIG. 3 having a dual output stage.

Referring now to FIG. 5, a circuit diagram illustrating an embodiment of the driver stage 34 of FIG. 3 having a dual output stage is shown. As in FIG. 4, a load 332 is coupled to OUT_P and OUT_M. FIG. 5 illustrates examples of the HV output stage 404, the LV output stage 424, and the bypass and HV block circuit 426 of FIG. 4. The HV output stage 404 includes an HVP portion and an HVN portion. The HVP portion includes a pair of p-channel HV FETs (HVP) whose sources are coupled to HV_SUPPLY and whose drains are coupled to OUT_M and OUT_P, respectively. The HVN portion includes a pair of n-channel HV FETs (HVN) whose sources are coupled to ground and whose drains are coupled to OUT_M and OUT_P, respectively. The LV output stage 424 includes an LVP portion and an LVN portion. The LVP portion includes a pair of p-channel LV FETs (LVP) whose sources are coupled to LV_SUPPLY. The drain of one of the LV p-channel FETs (LVP) is coupled to the bypass and HV block circuit 426 via a node A, and the drain of the other of the low voltage p-channel FETs (LVP) is coupled to the bypass and HV block circuit 426 via a node B. The LVN portion includes a pair of n-channel LV FETs (LVN) whose sources are coupled to ground. The drain of one of the n-channel LV FETs (LVN) is coupled to the bypass and HV block circuit 426 via node A and the drain of the other of the n-channel low voltage FETs (LVN) is coupled to the bypass and HV block circuit 426 via node B. As indicated in FIG. 5 by the thick bar on the drains of the HVP and HVN, these FETs are capable of handling higher voltages and dissipate more power than the LVP and LVN FETs. That is, advantageously, the LVP and LVN FETs dissipate significantly less power than the HVP and HVN FETs. The gates of the HVP and HVN FETs may be driven by an HV pre-driver (e.g., HV pre-driver 402 of FIG. 4) with a differential PWM signal, and the gates of the LVP and LVN FETs may be driven by an LV pre-driver (e.g., LV pre-driver 422 of FIG. 4) with a differential PWM signal. When the Class-D amplifier 22 is in LV mode, the HVP and HVN (as well as the associated HV pre-driver 402) are turned off in order to substantially reduce power dissipation; conversely, when the Class-D amplifier 22 is in HV mode, the LVP and LVN (as well as the associated LV pre-driver 422) are turned off. In one embodiment, the HVP, HVN, LVP, and LVN are turned off by being placed into a high impedance state (e.g., driving a high value into the gates of the HVP and LVP and driving a low value into the gates of the HVN and LVN), and the pre-drivers 402/422 are turned off by being biased with a very small current, which places them in a low power dissipation state.

The bypass and HV block circuit 426 includes a first clamp 502, a first capacitor C1 and a first buffer 504, each coupled between node A and a floating voltage VFLOAT at the cathode of a diode whose anode is coupled to a supply voltage node VP (e.g., battery). The first buffer 504 output is coupled to the gate of a first high-voltage n-channel FET HVN_bypass1 that operates as an interconnecting switch, or bypass switch, to selectively couple node A to node OUT_M. The bypass and HV block circuit 426 also includes a second clamp 512, a second capacitor C2 and a second buffer 514, each coupled between node B and the floating voltage VFLOAT. The second buffer 514 output is coupled to the gate of a second high-voltage n-channel FET HVN_bypass2 that operates as an interconnecting switch, or bypass switch, to selectively couple node B to node OUT_P.

The bypass switches HVN_bypass1 and HVN_bypass2 also serve to protect the LVP and LVN FETs from the high voltage supplied through the HVP from the HV_SUPPLY when the HVP are turned on.

The HV output stage 404 and LV output stage 424 are constructed under different power domains and with different types of devices. The bypass switches HVN_bypass1 and HVN_bypass2 (referred to collectively as bypass switches HVN_bypass) are of the HV type. When the bypass switches HVN_bypass are enabled, the LV output stage 424 is connected to the output load 332, and when the bypass switches HVN_bypass are disabled, they block the swing from the LV output stage 424 to the output load 332. The control of the bypass switches HVN_bypass is static, based on a power envelope detection of the output signal. The bypass switches HVN_bypass are powered by the local floating voltage supply VFLOAT. The floating voltage VFLOAT is created by a bootstrapping circuit (e.g., capacitors C1 and C2) that periodically gets replenished via a current I_cp whenever the low side switch LVN of the LV output stage 424 is enabled, as shown in FIG. 5.

During a mode transition between two output stages (e.g., 404 and 424), a "make before break" rule is followed regardless of which direction the operating mode is transitioning. For example, in a central edge modulation (CEM) scheme, a best mode transition point is at the beginning of a PWM period, which is initiated by a CEM start pulse. More specifically, to comply with the rule, the optimal location is the starting point of the phase when both low side switches HVN and LVN are enabled, at which time the ground return path is shared by both output stages 404 and 424. The transition timing is depicted in FIG. 6.

Figure 6:
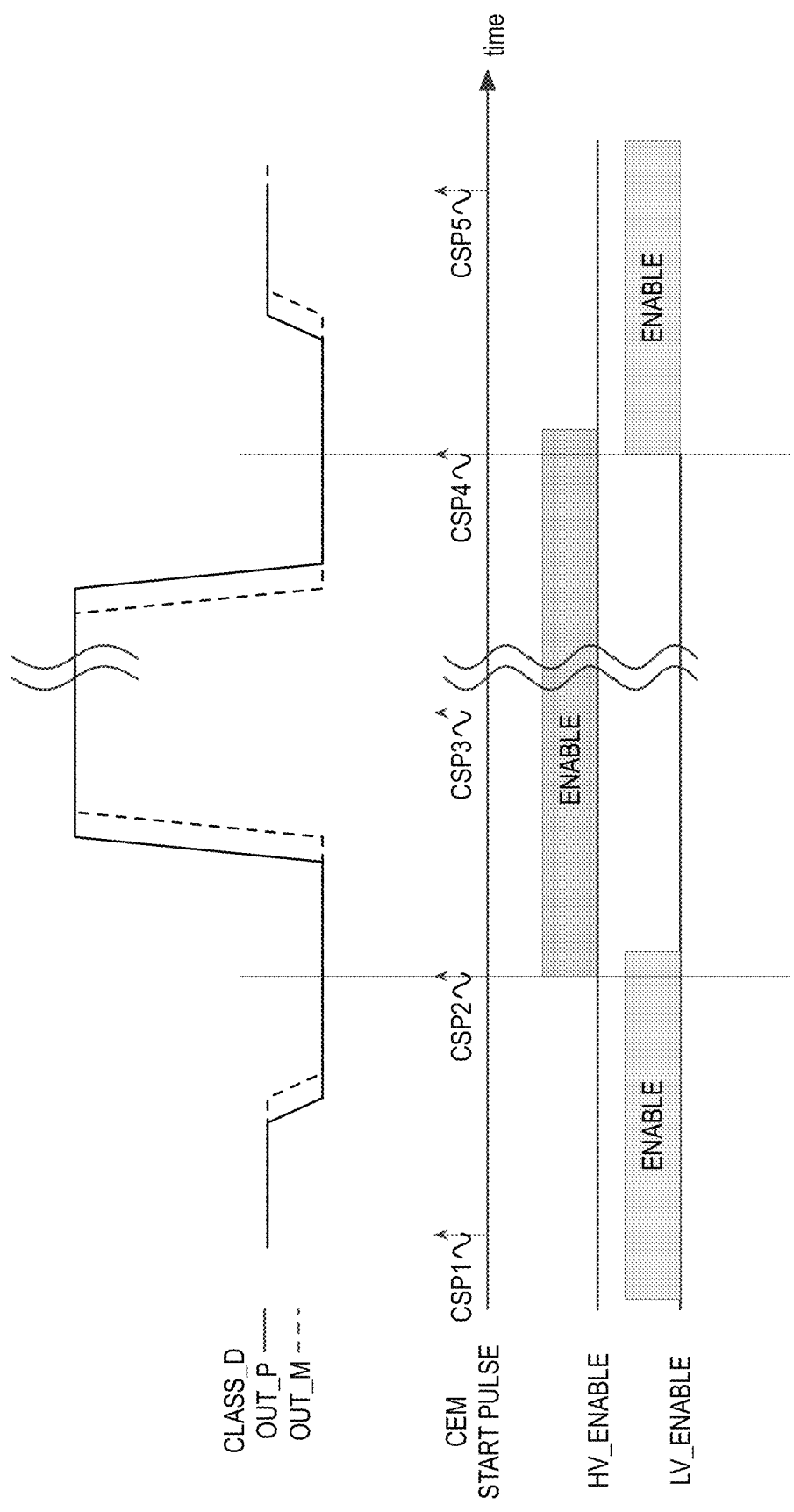
FIG. 6 is a timing diagram illustrating the timing of a transition from LV mode to HV mode and back to LV mode according to one embodiment of a dual output stage Class-D amplifier.

Referring now to FIG. 6, a timing diagram illustrating the timing of a transition from LV mode to HV mode and back to LV mode according to one embodiment of a dual output stage Class-D amplifier (e.g., driver stage 34 of FIG. 5) is shown. An example of the differential output signal waveform is shown as separate OUT_P and OUT_M waveforms (indicated by respective solid and dashed lines). A series of CEM start pulses (CSP1, CSP2, CSP3, CSP4, CSP5), each of which initiates a PWM period, is shown.

Upon reset, both the HV output stage 404 and the LV output stage 424 are disabled. More specifically, both the HV PMOS FETs (HVP) and HV NMOS FETs (HVN) in the HV output stage 404 and the LV PMOS FETs (LVP) in the LV output stage 424 and the bypass switches HVN_bypass are disabled, and only the LV NMOS FETs (LVN) are enabled. During steady state operation, either the HV FETs will toggle to deliver power to the speaker load 332 or LV FETs (through enabled bypass switches HVN_bypass) will toggle to deliver power to the speaker load 332. Control logic (not shown) performs a switch, or transition, from the HV output stage 404 to the LV output stage 424 (i.e., an operating mode transition from HV mode to LV mode) or from the LV output stage 424 to the HV output stage 404 (i.e., an operating mode transition from LV mode to HV mode) at the beginning of a PWM period, indicated by a CEM start pulse. For example, in FIG. 6 a transition from LV mode to HV mode is performed at the second CEM start pulse CSP2, and a transition from HV mode to LV mode is performed at the fourth CEM start pulse CSP4. At a transition from HV mode to LV mode, a control signal HV_ENABLE remains asserted that enables the HVN, a control signal LV_ENABLE is asserted that enables the LVN, and the bypass switches HVN_bypass are turned on to make a second ground path for load current through the LVN, quickly followed by the de-assertion of control signal HV_ENABLE to disable the HVN in HV output stage 404 to break the HVP and HVN from the loop. Similarly, at a transition from LV mode to HV mode, control signal LV_ENABLE remains asserted that enables the LVN, and control signal HV_ENABLE is asserted that enables the HVN to make a second ground path for the load current, quickly followed by turning off the bypass switches HVN_bypass to break the LVP and LVN from the loop. The time during which the amplifier 22 operates in each of the respective modes, HV or LV, may be long, e.g., many PWM periods. That is, the transitions between the HV and LV modes may occur infrequently with respect to the PWM period depending upon changes in the needed power level of the output signal.

The "make before break" rule that involves finite overlap between the HVN and LVN ground path ensures load current is always able to find a current return path so that voltage glitch at a mode transition is avoided. Preferably, the overlapping period is as small as possible so that any sudden change of return path impedance will not cause a significant voltage glitch across the load; hence, THDN degradation is minimized. As shown in FIG. 6, advantageously the control logic performs the mode transitions at the beginning of PWM periods and when both the HVN FETs and/or both the LVN FETs are on (i.e., both terminals of the load 332 are connected to a shared power rail, e.g., ground) and both the HVP FETs and both the LVP FETs are off. Doing so avoids a large voltage swing that could otherwise occur, which could cause a voltage glitch across the load 332 and result in THDN degradation. For example, if an HV mode to LV mode transition were performed at the third CEM start pulse CSP3, a swing from the HV_SUPPLY voltage to the LV_SUPPLY voltage could be seen across the load 332.

Figure 7:
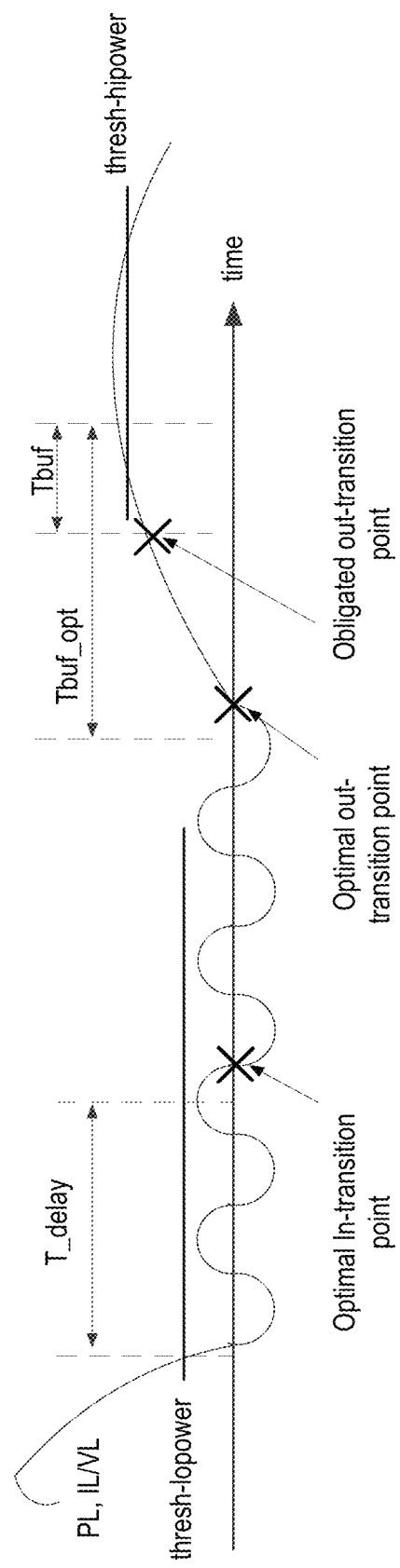
FIG. 7 is a timing diagram illustrating mode transitions between dual output stages according to one embodiment of a dual output stage Class-D amplifier.

Referring now to FIG. 7, a timing diagram illustrating mode transitions between dual output stages according to one embodiment of a dual output stage Class-D amplifier (e.g., amplifier 22 of FIG. 5) is shown. The timing diagram of FIG. 6 illustrates the timing of mode transitions at a micro-level, i.e., at the level of the switched output signal frequency (e.g., hundreds of kHz) in order to minimize THDN degradation; whereas, the timing diagram of FIG. 7 illustrates the timing of mode transitions at a macro-level, i.e., at the level of the baseband input signal frequency (e.g., tens of kHz in the audio range) in order to minimize THDN degradation. As long as demanded output power is higher than a first threshold (thresh_hipower), the HV output stage 404 is enabled and the LV output stage 424 is disabled, and if demanded output power is lower than a second threshold (thresh_lopower), the LV output stage 424 is enabled and the HV output stage 404 is disabled. The inactive output devices (e.g., HVP and HVN, or LVP and LVN) along with associated pre-driver circuits (e.g., HV pre-driver 402 or LV pre-driver 422) are powered down to reduce quiescent biasing current down to a minimum. The separation between the two thresholds (i.e., thresh_hipower and thresh_lopower) is designed to avoid oscillatory switching between the HV and LV output stages 404/424. In one embodiment, the demanded output power must remain below the low power threshold thresh_lopower for a delay (e.g., T_delay of FIG. 7) before a transition from HV mode into LV mode is performed, denoted as the optimal in-transition point in FIG. 7. The delay serves as a time-based hysteresis mechanism to reduce overly frequent transitioning between modes. In one embodiment, an optional look-ahead buffer (e.g., Tbuf_opt) is inserted in the datapath that may be used to determine a best out-transition location (transition from LV mode to HV mode), e.g., at the last voltage zero crossing (VZC) before the demanded output power rises above the high power threshold thresh_hipower. That is, the datapath may buffer the output signal long enough to detect that the demanded output power is above the high power threshold thresh_hipower and yet still remember the most recent previous VZC in order to make the THDN-optimizing transition from LV mode to HV mode. In one embodiment, an obligated out-transition point is asserted (i.e., transition from LV mode to HV mode) if the look-ahead buffer depth is not sufficient to determine the optimal out-transition location. In one embodiment, a current zero crossing (IZC), rather than a VZC, is detected and used as the location for making an operating mode transition.

Figure 8:
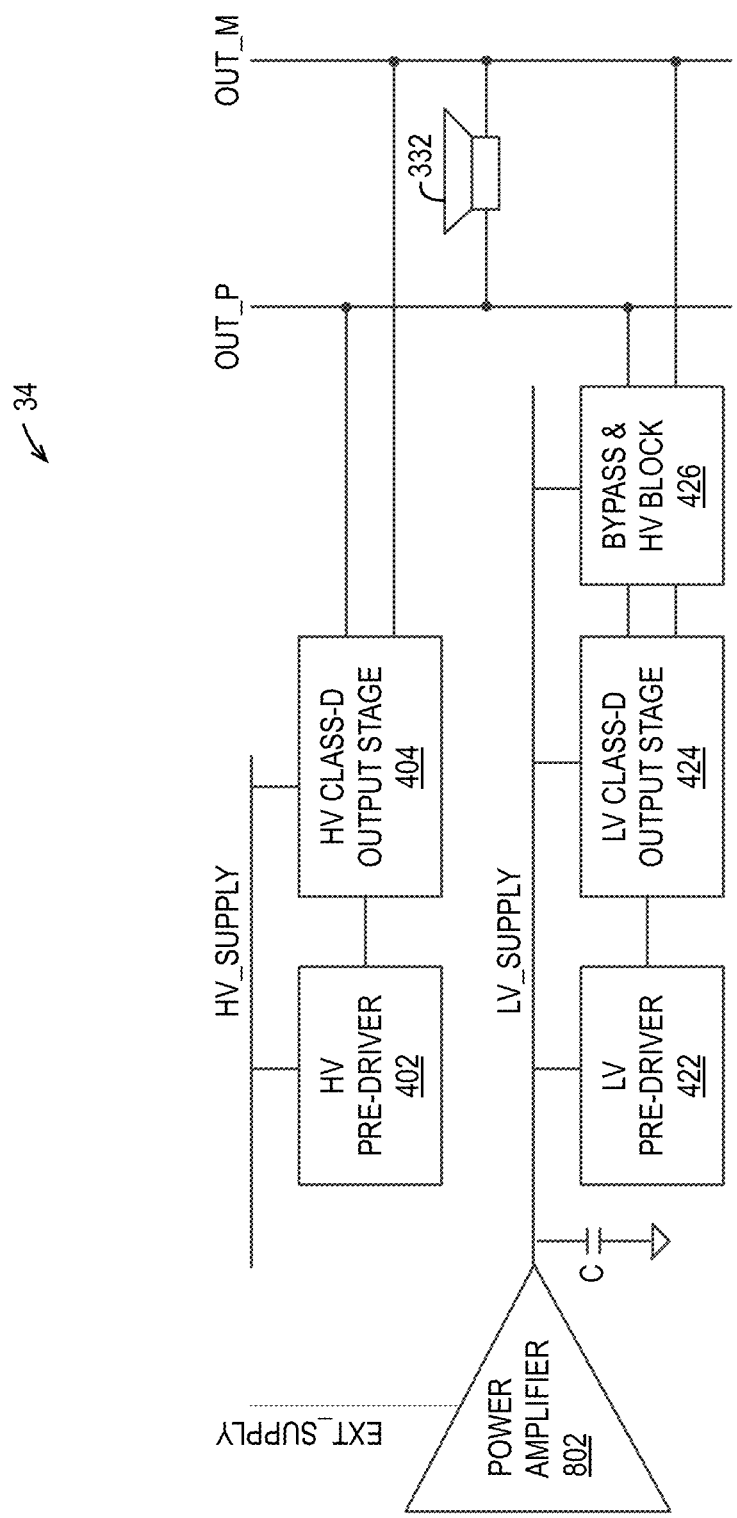
FIG. 8 is a block diagram illustrating an alternate embodiment of the driver stage of FIG. 3 of a Class-D amplifier having dual parallel output stages.

Referring now to FIG. 8, a block diagram illustrating an alternate embodiment of the driver stage 34 of FIG. 3 of a Class-D amplifier (e.g., amplifier 22 of FIG. 2) having dual parallel output stages is shown. The embodiment of FIG. 8 is similar in many respects to the embodiment of FIG. 4 and like-numbered elements are similar. However, in the embodiment of FIG. 8, the Class-D amplifier 22 also includes a power voltage buffer amplifier 802 internal to the audio IC 9 that comprises the Class-D amplifier 22. The power voltage buffer amplifier 802 receives an external supply voltage EXT_SUPPLY that may be provided from a system level. For example, a power source (e.g., 12V boost, 4.3V battery, 1.8V analog voltage rail) of the personal audio device 1 of FIG. 1A external to the audio IC 9 may provide the external supply voltage EXT_SUPPLY to the amplifier 22. In the embodiment of FIG. 8, the power voltage buffer amplifier 802 uses the external supply voltage EXT_SUPPLY to generate the LV_SUPPLY that is provided to the LV pre-driver 422, LV Class-D output stage 424, and bypass and HV block circuit 426. Although FIG. 8 shows only generation of the LV_SUPPLY, the power voltage buffer amplifier 802 may also generate other level supply voltages (e.g., MV_SUPPLY). In one embodiment, the power voltage buffer amplifier 802 generates a supply voltage at a level that is different from the received level, e.g., the power voltage buffer amplifier 802 may receive a 1.8V level and generate a 1.0V level supply voltage. In one embodiment, the power voltage buffer amplifier 802 comprises a low drop out (LDO) voltage regulator.

Differential Mode Error During HV/LV Stage Switching and Solutions

Major differential errors caused by output stage mode switching include the following factors: quantizer gain mismatch; propagation delay mismatch between the HV and LV path; signal dependent propagation delay on the quantizer; output stage impedance mismatch. The first two factors may be calibrated out during product test. The third factor may be minimized by adopting a high gain, high bandwidth (BW) comparator. The fourth factor is explained below.

Given a finite impedance of the driver stage 34, the voltage applied on the speaker load 332 will be different from the nominal voltage measured from the supply (e.g., HV_SUPPLY, MV_SUPPLY, LV_SUPPLY). For example, a 0.1 Ohm Rdson (e.g., of an output stage FET) will result in a 0.1V IR drop when 1A of current flows through the load 332; thus, the voltage the load 332 sees behind Rdson is 0.1V less than the supply voltage. The theoretical duty cycle expression at the output stage is given by equation (1).

$$DUTYCYCLE = \frac{SVint2}{Vramp} = \frac{Vo + IL*\text{Rds\_tot}}{Vspk} \quad (1)$$

In equation (1), SVint2 represents a system variable that is the average value of the output voltage V_INT2 of the second integrator INT2 of the loop filter 302 of the Class-D amplifier 22 of FIG. 3. Vramp represents the amplitude of the ramp voltage used by the quantizer 304 of FIG. 3 to generate the PWM output signal. Vo represents the average output voltage provided to the load 332. IL represents the load current. Rds_tot represents the total Rdson of the output stage (e.g., 404 and 424, as well as HVN_BYPASS1 and HVN_BYPASS2 when in LV mode). Vspk represents the power supply voltage (e.g., HV_SUPPLY, MV_SUPPLY, or LV_SUPPLY). In order not to disturb SVint2 as the supply voltage Vspk suddenly decreases (e.g., from 12V to 1.2V) and the ramp amplitude Vramp scales by the same amount, the product IL*Rds_tot needs to be maintained as constant in order to match the impedance of the HV output stage to the LV output stage, when the load current IL is nonzero. On the other hand, the product IL*Rds_tot will be zero if the transition happens at the load current zero crossing even when the impedance is not matched. Both current zero crossing detection (e.g., as used to find the "Optimal out-transition point" in FIG. 7), and impedance matching may be performed to maximally reduce the residual error given by each term (see equation (2) below). Additionally, the current zero crossing detection may be replaced by voltage zero crossing detection at low frequency (e.g., audio baseband frequency). The replacement of the current zero crossing with the voltage zero crossing may result in a minor phase difference, which may be exchanged for the benefit of less circuit complexity.

If the load current is available, an IR drop compensation circuit (e.g., circuit 900 of FIG. 9) may be built around an output stage to further reduce the IL*Rds_tot error during a mode transition. Total error voltage may be expressed in equation (2).

$$\text{total error voltage} = IL*(Rds\_tot\_HV - Rds\_tot\_LV)* \\ LPF(s)*\Delta gain\_ircomp \quad (2)$$

In equation (2), Rds_tot_HV represents the total Rdson of the HV output stage 404, and Rds_tot_LV represents the total Rdson of the LV output stage 424. LPF(s) represents a transfer function of a low pass filter (LPF) along the load current sensing path (e.g., LPF 902 of FIG. 9). The factor Δgain_ircomp is the gain difference between the reciprocal of the combined gain of the quantizer 304 and driver stage 34 in HV mode and in LV mode. The combined gain of the quantizer 304 and driver stage 34 (e.g., 10) is defined as the ratio of the power supply voltage Vspk (e.g., HV_SUPPLY or LV_SUPPLY) to the ramp voltage Vramp.

Because total error after applying IR drop compensation is a product of multiple terms (as described above with respect to equation (2) and below with respect to FIG. 9), the total error after IR compensation may be very close to zero even when each term is not zero. Therefore, advantageously when IR drop compensation is employed, the circuit requirement may be more relaxed, and glitch on the second integrator INT2 may be well controlled to a minimum.

Figure 9:
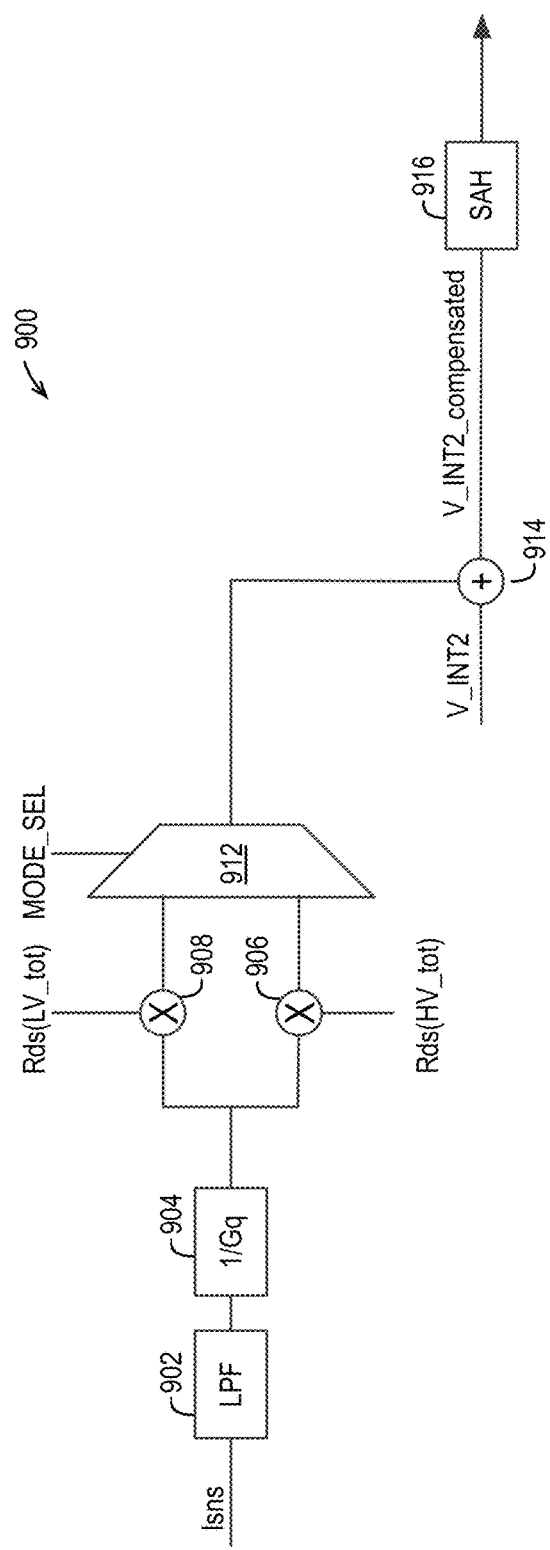
FIG. 9 is a conceptual block diagram illustrating an IR drop compensation circuit for use in a Class-D amplifier having multiple different supply level output stages according to an embodiment.

Referring now to FIG. 9, a conceptual block diagram illustrating an IR drop compensation circuit 900 for use in a Class-D amplifier (e.g., amplifier 22 of FIG. 2) having multiple different supply level output stages (e.g., HV output stage 404 and LV output stage 424 of FIG. 4) according to an embodiment is shown. A low-pass filter (LPF) 902 receives a sensed load current $I_{SNS}$ (i.e., through load 332). The LPF 902 may be necessary particularly when the sensed load current $I_{SNS}$ is noisy. The LPF 902 provides its output to a reciprocator 904 that multiplies the output of the LPF 902 by the reciprocal of the gain of the quantizer 304 of FIG. 3. In one embodiment, the gain of the quantizer 304 varies depending upon whether the amplifier 22 is operating in HV or LV mode. First and second multipliers 906 and 908 multiply the output of the reciprocator 904 by Rds(HV_tot) and Rds(LV_tot), respectively, and provide their respective products to a multiplexer 912 that selects one of its inputs based on a control input mode_sel that indicates the operating mode (i.e., HV mode or LV mode). Rds(HV_tot) and Rds(LV_tot) are measured values of the total Rdson of the HV output stage 404 and the LV output stage 424, respectively. The output of the multiplexer 912 is added by an addition element 914 to the output voltage V_INT2 of the second integrator INT2 of FIG. 3 to produce a compensated voltage V_INT2_compensated. The compensated voltage V_INT2_compensated is provided to a sample-and-hold circuit (SAH) 916 which provides its output to the quantizer 304. Advantageously, the addition element 914 performs the addition after integrator capacitors around the second integrator INT2 (of FIG. 10) and is therefore not remembered by the integrator capacitors.

Figure 10:
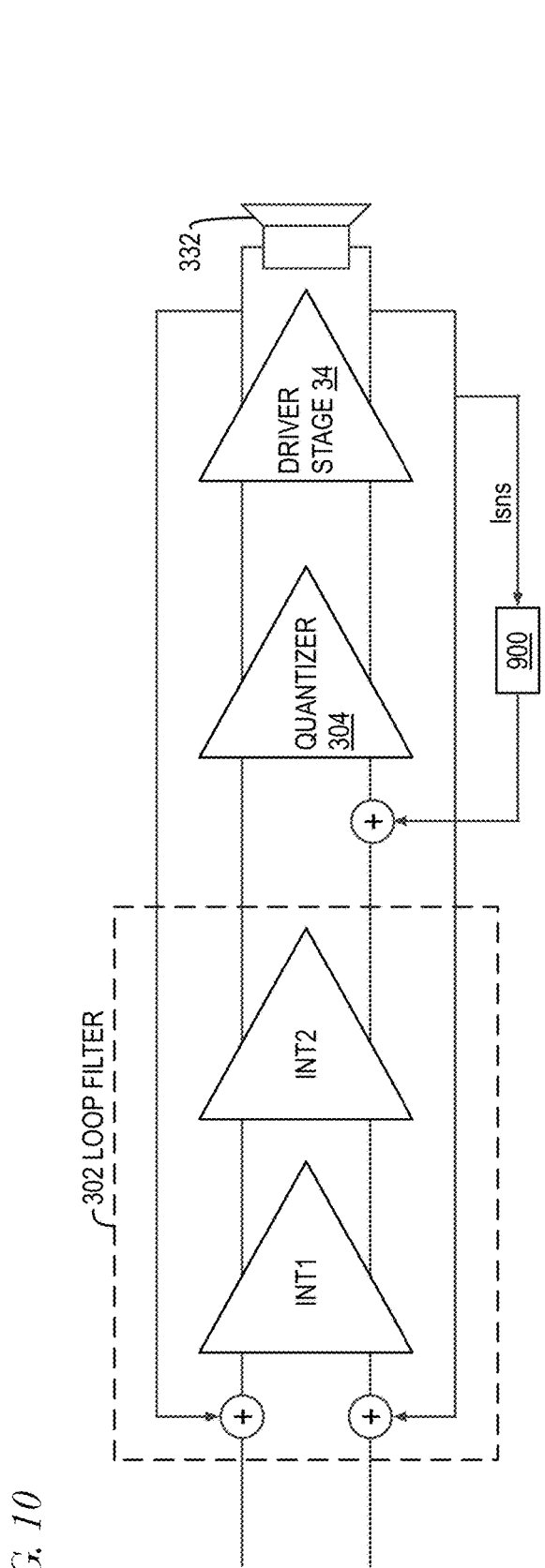
FIG. 10 is a block diagram illustrating an embodiment of portions of the Class-D amplifier of FIG. 2.

Referring now to FIG. 10, a block diagram illustrating an embodiment of portions of the Class-D amplifier 22 of FIG. 2 is shown. FIG. 10 is similar to FIG. 3 in many respects. However, the IR drop compensation circuit 900 of FIG. 9 receives the sensed load current $I_{SNS}$. The output of the IR drop compensation circuit 900 is provided to a summing element that sums the output voltage V_INT2 of the second integrator INT2 and provides its sum to the quantizer 304.

Embodiments are described herein that operate to minimize error caused by mode transitions between the output stages, e.g., glitches caused by IR drop. If errors still occur, the loop of amplifier 22 will attempt to correct the error. However, advantageously the IR drop compensation circuit 900 of FIG. 9 may be employed to reduce the error that needs to be corrected.

Rectifying the polarity of the load current for the correction factor is not needed. However, compensation may be needed for a relative quantity that is not memorized by the loop filter 302 whenever there is a mode transition.

Output Glitch Due to Sudden Common-Mode Output Voltage Step and Countermeasures

Mismatch of the resistors and capacitors between the two differential paths around the speaker amplifier 22 may cause the differential output value of the amplifier 22 (e.g., difference between OUT_P and OUT_M) to have certain dependencies on the output common-mode voltage (VCMO) of the amplifier 22. The output common-mode voltage VCMO is the average of the differential output voltage at OUT_P and OUT_M over a CEM-based PWM period, which is also half the power supply voltage Vspk on average over a CEM-based PWM period. When, at any time, output common-mode voltage VCMO changes (e.g., due to a mode transition from HV to LV mode or vice versa), an output DC offset due to the resistor mismatch has been observed, and a transient glitch due to a mismatch in the RC time constant of the first integrator INT1 has been observed.

Figure 11:
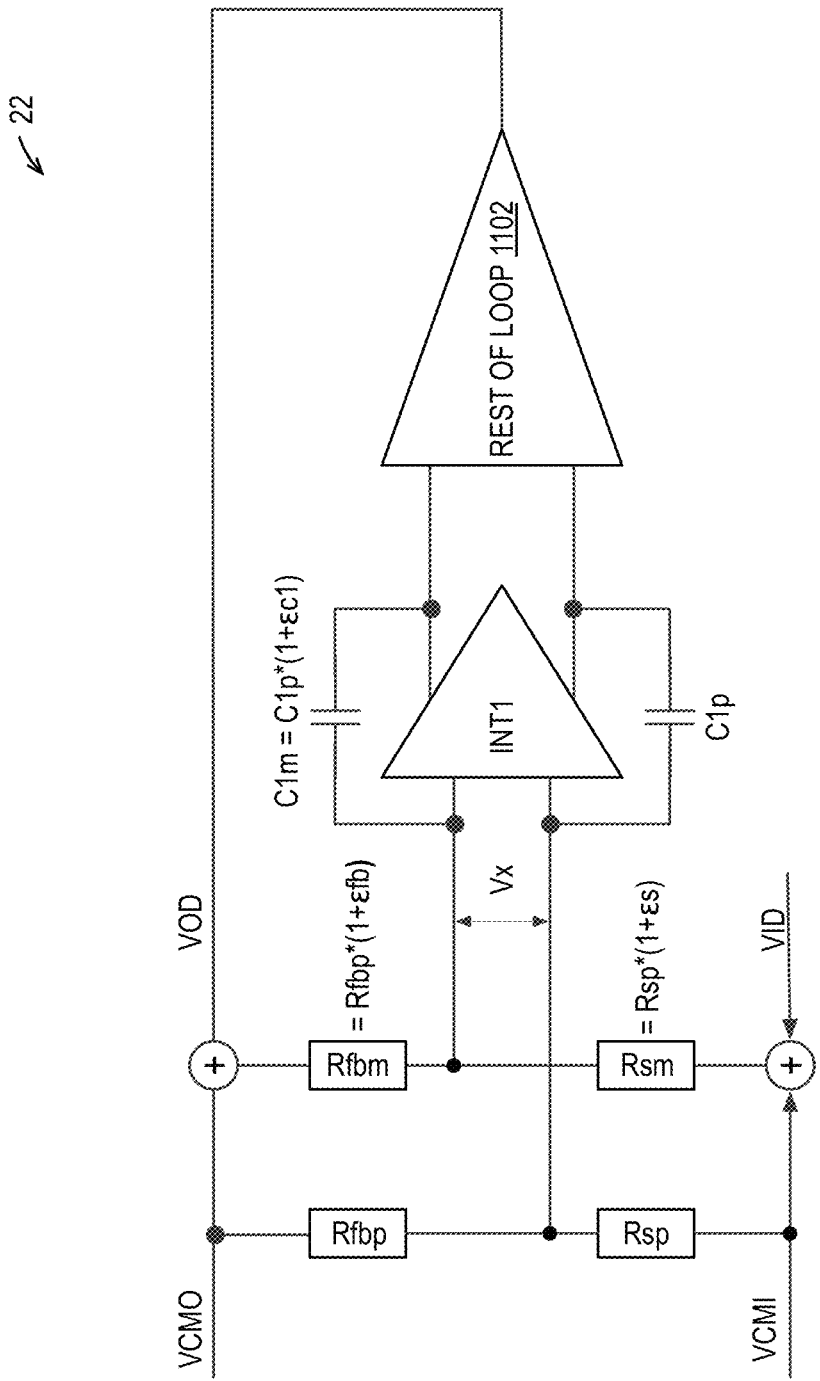
FIG. 11 is a simplified resistor mismatch model of portions of the Class-D amplifier of FIG. 3 according to an embodiment.

Referring now to FIG. 11, a simplified resistor mismatch model of portions of the Class-D amplifier 22 of FIG. 3 according to an embodiment is shown. The embodiment of FIG. 11 includes the first integrator INT1 of FIG. 3, and the remaining stages (i.e., second integrator INT2, quantizer 304, and driver stage 34) are shown as rest of loop 1102. A virtual ground Vx is shown across the differential input to the first integrator, i.e., across the differential m and p paths. A first integrating capacitor C1m is connected between the input and output of the first integrator INT1 on its m path, and a second integrating capacitor C1p is connected between the input and output of the first integrator INT1 on its p path.

The differential output voltage VOD (i.e., difference of OUT_P and OUT_M, shown in FIG. 11 as a single path) is fed back from the rest of loop 1102 to a first summing element that also receives the output common-mode voltage VCMO and provides its sum to a feedback resistor Rfbm of the m path. The other side of the m path feedback resistor Rfbm is connected to the m path input of the first integrator INT1. The differential input voltage VID (i.e., the differential output of the DAC of FIG. 3, shown in FIG. 11 as a single path) is provided to a second summing element that also receives the input common-mode voltage VCMI and provides its sum to an input resistor Rsm of the m path. The other side of the m path input resistor Rsm is connected to the m path input of the first integrator INT1. A p path feedback resistor Rfbp receives the output common-mode voltage VCMO and provides its output to the p path input of the first integrator INT1. A p path input resistor Rsp receives the input common-mode voltage VCMI and provides its output to the p path input of the first integrator INTL.

In the simplified model of FIG. 11, the circuit components Rfbp, Rsp, and C1p along the p path are treated as a reference. Corresponding components along the m path are shown as having an error due to mismatch with the values of the corresponding components of the p path, more specifically, the value of Rfbm=Rfbp*(1+εfb), the value of Rsm=Rsp*(1+εS), and the value of C1m=C1p*(1+εc1). As may be observed from equations (3) and (4) below, to zero out the dependency of the virtual ground Vx of the first integrator INT1 on the output common-mode voltage VCMO, εs must be set equal to εtot, which indicates that the resistor ratio from both sides must be matched for infinite CMRR.

$$\frac{Vx}{VCMO - VCMI} = \frac{Rsp}{Rsp + Rfbp} \times \left(1 - \frac{1 + \varepsilon s}{1 + \varepsilon tot}\right) \quad (3)$$

$$\varepsilon tot = 1 - \frac{Rfbm + Rsm}{Rfbp + Rsp}, \varepsilon s = 1 - \frac{Rsm}{Rsp}, \varepsilon fb = 1 - \frac{Rfbm}{Rfbp} \quad (4)$$

In-band audible glitch energy may be controlled by avoiding sudden increases, as may be required by a pop-click specification threshold. Avoiding the sudden increases may be achieved by a power voltage buffer amplifier that moves the power supply voltage Vspk for the output stage smoothly between the HV and LV domains, as shown in FIG. 12.

Figure 12:
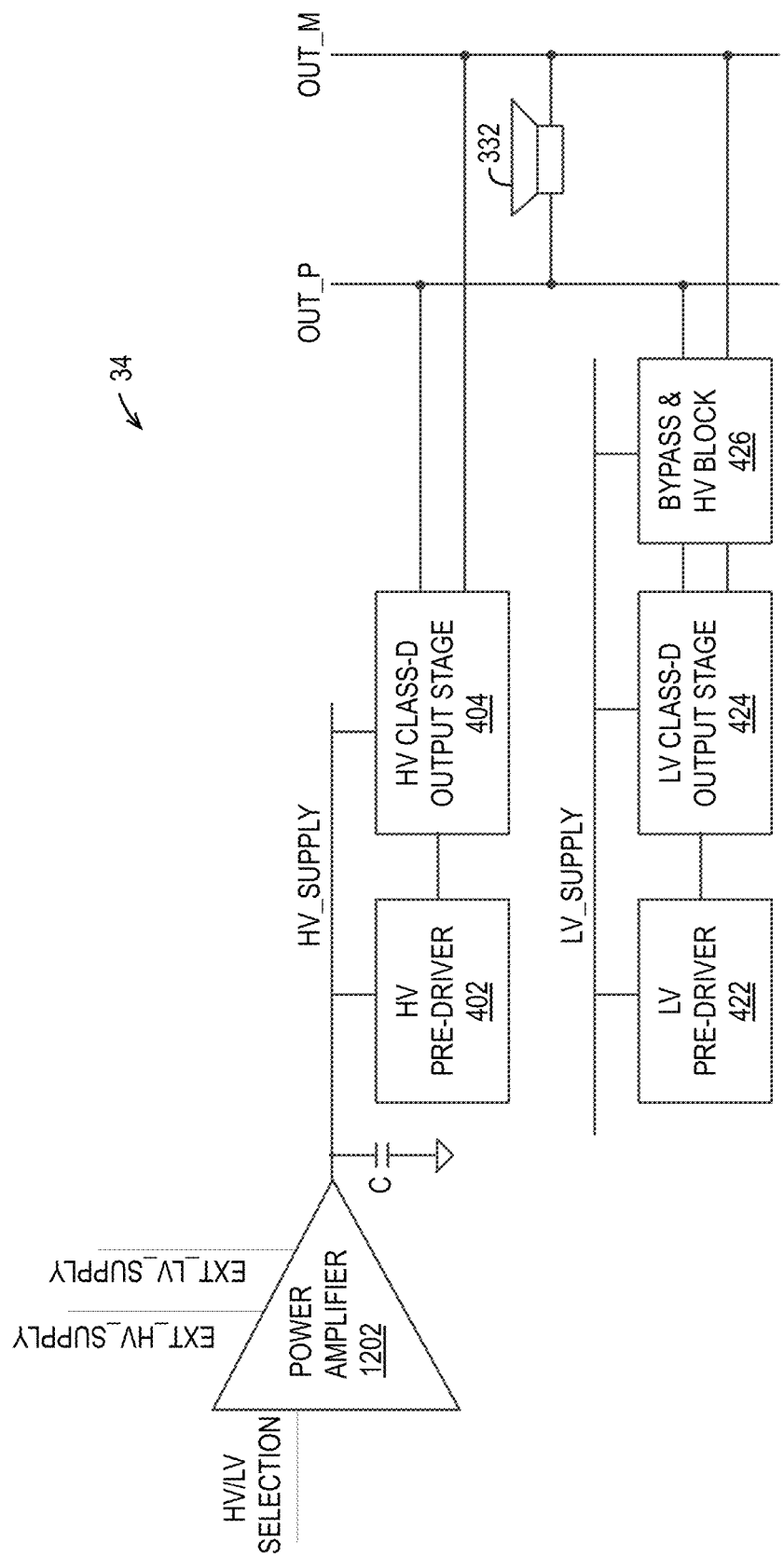
FIG. 12 is a block diagram illustrating an alternate embodiment of the driver stage of FIG. 3 having dual parallel output stages.

Referring now to FIG. 12, a block diagram illustrating an alternate embodiment of the driver stage 34 of FIG. 3 having dual parallel output stages is shown. The embodiment of FIG. 12 is similar in many respects to the embodiment of FIG. 4 and like-numbered elements are similar. In one embodiment, the high and low supply voltages HV_SUPPLY and LV_SUPPLY may be provided from a system level. For example, power sources (e.g., 12V boost, 4.3V battery, 1.8V analog voltage rail) of the personal audio device 1 of FIG. 1A external to the audio IC 9 may provide the different supply voltages EXT_HV_SUPPLY and EXT_LV_SUPPLY to the amplifier 22. However, in the embodiment of FIG. 12, the Class-D amplifier 22 also includes a power voltage buffer amplifier 1202 internal to the audio IC 9 that comprises the Class-D amplifier 22. In the embodiment of FIG. 12, the power voltage buffer amplifier 1202 receives external HV and LV supply voltages EXT_HV_SUPPLY and EXT_LV_SUPPLY and uses them to generate the HV_SUPPLY that is provided to the HV pre-driver 402 and HV Class-D output stage 404. When a transition from HV mode to LV mode is desired, the power voltage buffer amplifier 1202 smoothly moves the supply voltage HV_SUPPLY from its normal high level (e.g., 12V) to the LV level (e.g., 4.3V or 1.8V). Once the HV_SUPPLY rail is providing the same voltage level as the LV_SUPPLY rail, the control logic causes a transition from the HV output stage 404 driving the load 332 to the LV output stage 424 driving the load 332. To cause the HV to LV transition, preferably, the control logic turns on the LVN and LVP and bypass switches HVN_BYPASS1 and HVN_BYPASS2, then places the HVP and HVN in a high-impedance state (and turns off the HV pre-driver 402) in a make-before-break fashion as described above with respect to FIG. 6. When a transition from LV mode to HV mode is desired, the power voltage buffer amplifier 1202 smoothly moves the supply voltage HV_SUPPLY from the LV level (e.g., 4.3V or 1.8V) to its normal high level (e.g., 12V). Once the HV_SUPPLY rail is providing the high voltage level, the control logic causes a transition from the LV output stage 424 driving the load 332 to the HV output stage 404 driving the load 332. To cause the LV to HV transition, preferably, the control logic turns on the HVP and HVN, then places the LVN and LVP in a high-impedance state (and turns off the LV pre-driver 422) and turns off the bypass switches HVN_BYPASS1 and HVN_BYPASS2 in a make-before-break fashion as described above with respect to FIG. 6. In one embodiment, the power voltage buffer amplifier 1202 comprises a low drop out (LDO) voltage regulator.

A disadvantage of the solution of FIG. 12 is that it may require additional area, power, and bill of materials (BOM) count penalties. On the other hand, removing the power buffer 802 may require immediate compensation either at the input or output of the speaker amplifier 22. Unfortunately, such compensation is not compatible with a baseband signal that contains significant out-of-band-noise (OOBN). Therefore, embodiments are described below that improve a common mode rejection ratio/power supply rejection ratio (CMRR/PSRR) of the speaker amplifier 22, so the common-mode signal may be rejected locally as much as possible. In one embodiment, the VCMO is half the power supply voltage Vspk; consequently, the PSRR and CMRR are directly related.

Figure 13:
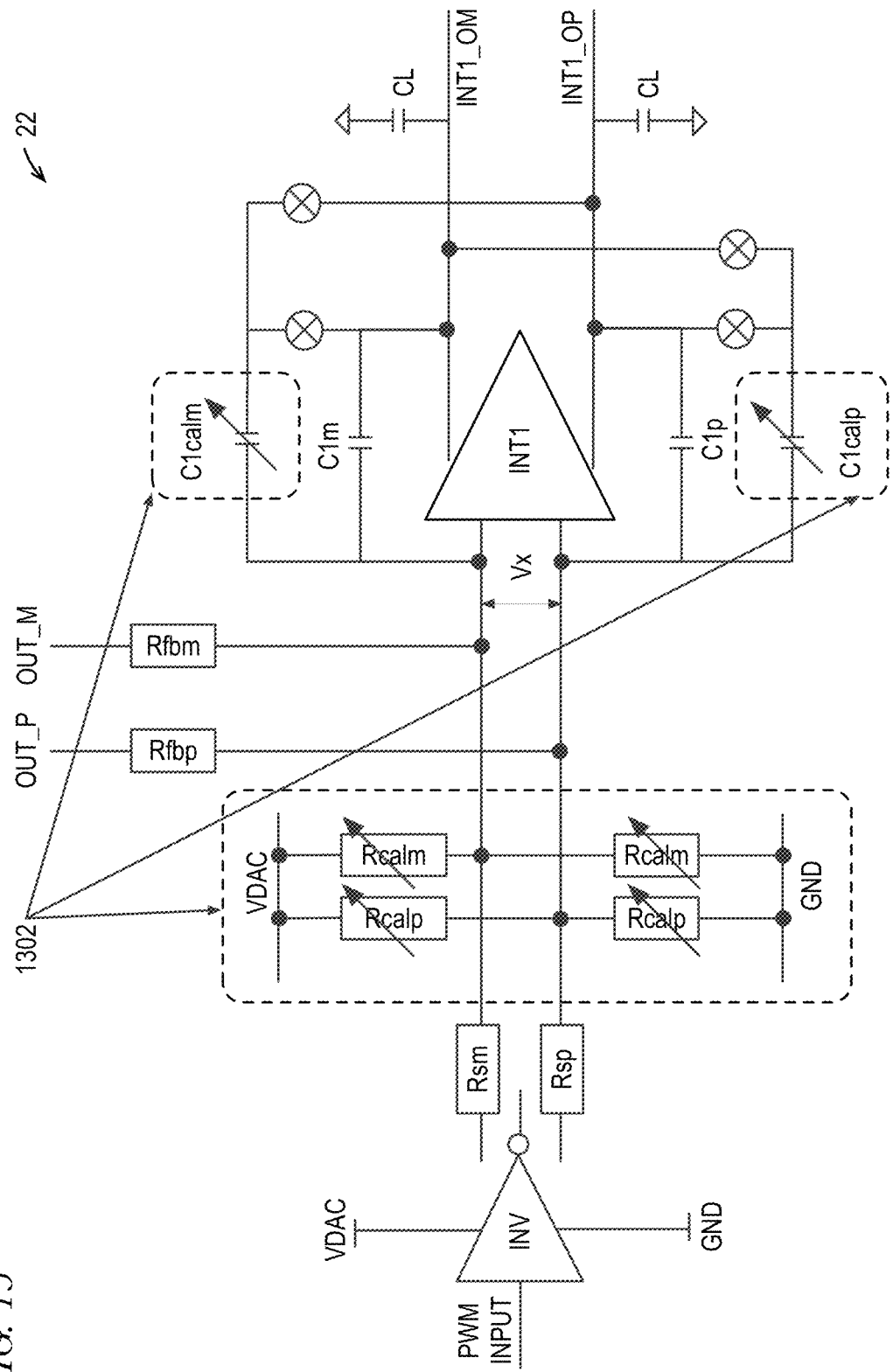
FIG. 13 is a diagram illustrating an embodiment of a calibration circuit around the first integrator INT1 of the D-class amplifier of FIG. 3 and calibration methodology to improve broadband CMRR/PSRR.

Referring now to FIG. 13, a diagram illustrating an embodiment of a calibration circuit 1302 around the first integrator INT1 of the D-class amplifier 22 of FIG. 3 and calibration methodology to improve broadband CMRR/PSRR is shown. A theoretical calculation shows that to achieve 90 dB of PSRR and ~80 dB of THDN, mismatch between the differential p and m paths of the resistor ratio of the feedback resistor Rfb and the input resistor Rs must be less than 0.003% and the RC time constant mismatch between the differential p and m paths around the first integrator INT1 must be less than 0.1%.

The calibration circuit 1302 of FIG. 13 may be understood with reference to the simplified resistor mismatch model of FIG. 11. FIG. 13 shows the calibration circuit 1302 around the first integrator INT1 that includes a p path trim resistor array Rcalp and an m path trim resistor array Rcalm used to trim a ratio of the feedback to input resistor Rfb/Rs for one or both of the p path and m path such that the p path and m path ratios match. The calibration circuit 1302 also includes an m path trim capacitor array C1calm and a p path trim capacitor array C1calp used to match RC time constants of the m and p paths. In one embodiment, trim resistor arrays Rcalp and Rcalm comprise resistor trim arrays that may be programmed with different code values to specify different resistance values during calibration. In another embodiment, one or more of the input resistors Rsp and Rsm and feedback resistors Rfbp and Rfbm may be laser trimmed to the desired value during calibration, in which case the trim resistor arrays Rcalp and Rcalm may be absent. In one embodiment, the RC time constant trim capacitor arrays C1calm and C1calp comprise trim capacitor arrays that may be programmed with different code values to specify different capacitance values during calibration. In another embodiment, one or more of the integrating capacitors C1$m$ and C1$p$ may be laser trimmed to the desired value during calibration, in which case the RC time constant trims C1calm and C1calp may be absent.

The differential output paths of the first integrator INT1 are shown as INT1_OP and INT1_OM, each of which is connected to ground via a respective capacitor CL. The output portion of the DAC of FIG. 3 is shown in FIG. 13 as an inverter INV that receives a PWM input signal. The DAC is biased by a DAC reference voltage VDAC and ground, as is inverter INV. The DAC output has differential output resistance on its differential output paths which are the m path input resistor Rsm connected to the first integrator INT1 $m$ path input and the p path input resistor Rsp connected to the first integrator INT1 $p$ path input. The m path feedback resistor Rfbm is connected between the m path load output OUT_M and the first integrator INT1 $m$ path input, and the p path feedback resistor Rfbp is connected between the p path load output OUT_P and the first integrator INT1 $p$ path input. The p path trim resistor arrays Rcalp are connected between the DAC reference voltage VDAC and ground to alternate sides of the first integrator INT1 $p$ path input, and the m path trim resistor arrays Rcalm are connected between the DAC reference voltage VDAC and ground to alternate sides of the first integrator INT1 $m$ path input. One side of the m path trim capacitor array C1calm is connected to the first integrator INT1 $m$ path input, and the other side is selectively connected through respective switches to the differential outputs of the first integrator INT1 INT1_OM and INT1_OP. One side of the p path trim capacitor array C1calp is connected to the first integrator INT1 $p$ path input, and the other side is selectively connected through respective switches to the differential outputs of the first integrator INT1 INT1_OM and INT1_OP.

In order to maximize PSRR and minimize performance drifting before/after calibration, both trim circuits are fully-differentially laid out around the first integrator INT1, and the virtual ground Vx of the first integrator INT1 is configured to not touch any PN junctions either from FET switches or any nonlinear devices, such as metal-oxide-semiconductor field-effect transistor (MOSFET) capacitors, which are known to have very high voltage/temperature coefficients.

The RC time constant trim capacitor arrays C1calp and C1calm that are not required to balance the differential RC time constant are cross-connected (instead of being shorted around themselves) to the other side of the first integrator INT1 output node, as shown in FIG. 13, with low impedance.

The trim resistor array configuration is static and complementary. That is, the trim resistor arrays Rcalp and Rcalm do not toggle with the main PWM DAC resistors, referred to in FIG. 13 as Rsm and Rsp. Instead, the trim resistor arrays Rcalp and Rcalm are wired through N/PFET switches (not shown), touching either ground or the DAC reference voltage VDAC which also have low impedance, leaving uncontaminated the other end of the trim resistor array Rcalp and Rcalm, which is the virtual ground Vx of the first integrator INT1. For each trimming code, the resistance of pull-up and pull-down portions of the trim resistor array is designed to be identical, creating a zero current into virtual ground Vx. The complementary trim resistor array is equivalent to two single resistors, placed in parallel to the input resistors Rsm and Rsp (the DAC output resistors). By sizing the trim resistor arrays Rcalp and Rcalm N times larger than the main input resistors Rsp and Rsm, in which N is a number at least greater than one, a much higher trimming accuracy is achieved without tiny least significant bit (LSB) resistance, which is required in the direct trim approach.

For example, when nominal Rcal resistance is set to one hundred (100) times the size of the input resistors Rsm and Rsp, with 0.1% of trimming LSB, effective trim resolution may be as fine as 0.003%, achieving better than 90 dB of CMRR. In one embodiment, the trimming range is +/−0.1%.

The calibration procedure includes two steps: resistor ratio trim followed by RC time constant trim, i.e., capacitor trim. After calibration, the speaker modulator has good broadband CMRR, so fluctuations on the output stage power supply may be maximally rejected.

Figure 14:
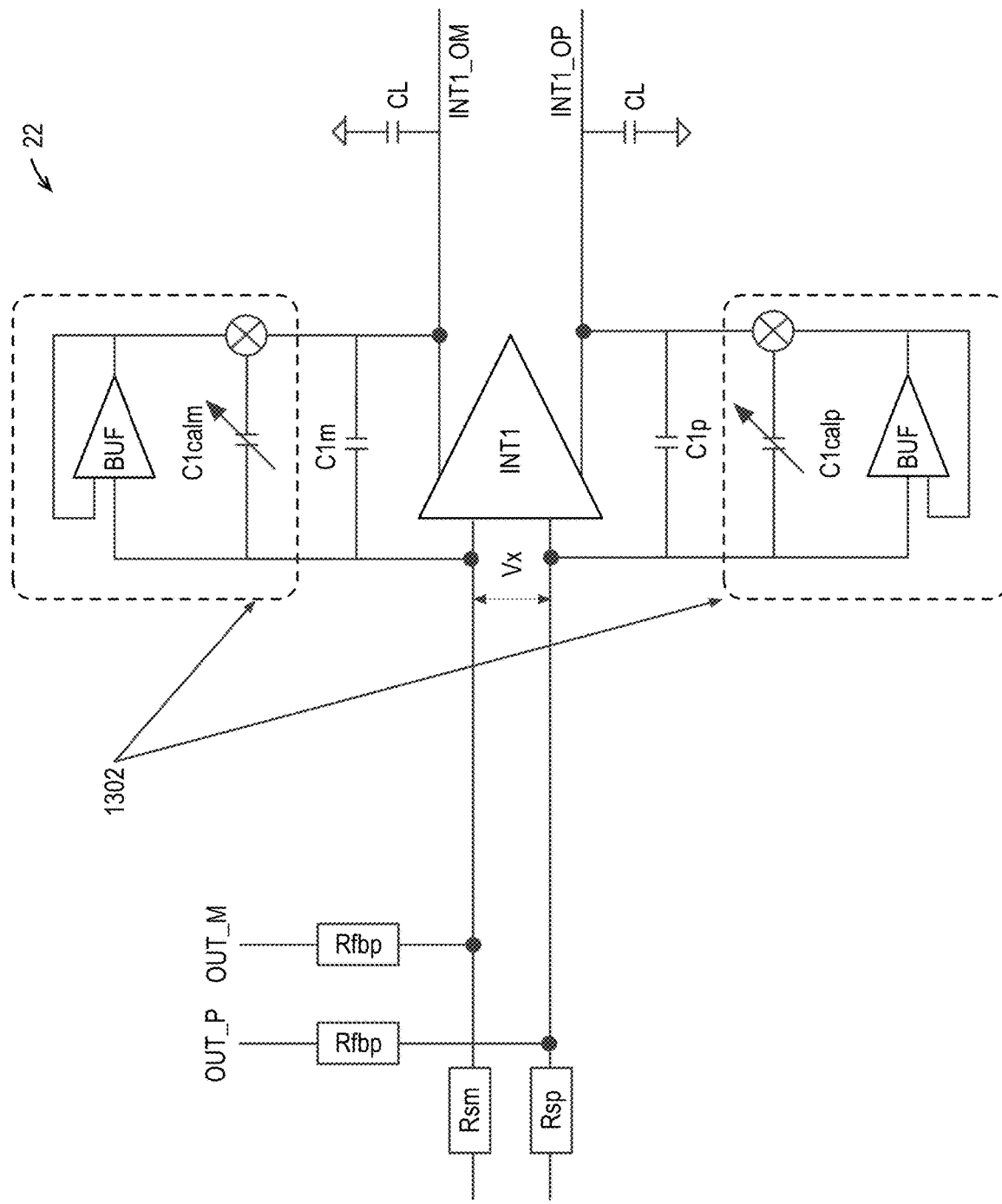
FIG. 14 is a circuit diagram illustrating an alternate embodiment of portions of the calibration circuit of the D-class amplifier of FIG. 13.

Referring now to FIG. 14, a circuit diagram illustrating an alternate embodiment of portions of the calibration circuit 1302 of the D-class amplifier 22 of FIG. 13 is shown. In the embodiment of FIG. 14, as in the embodiment of FIG. 13, one side of the m path trim capacitor array C1calm is coupled to the first integrator INT1 m path input, and the other side is selectively coupled through a switch to the first integrator INT1 m path output INT1_OM. However, in the embodiment of FIG. 14, the switch is a double pole single throw switch that may be thrown to couple the other side of the m path trim capacitor array C1calm to the output of a buffer BUF (e.g., unitary gain operational amplifier) whose input is coupled to the first integrator INT1 m path input. Similarly, one side of the p path trim capacitor array C1calp is coupled to the first integrator INT1 p path input, and the other side is selectively coupled through a switch to the first integrator INT1 p path output INT1_OP. However, in the embodiment of FIG. 14, the switch is a double pole single throw switch that may be thrown to couple the other side of the p path trim capacitor array C1calp to the output of a buffer BUF (e.g., unitary gain operational amplifier) whose input is coupled to the first integrator INT1 p path input. Either of the switches may be thrown to couple the other side of its associated RC time constant trim C1cal to its associated buffer BUF in order to create a zero potential across the RC time constant trim capacitor array C1cal to effectively remove any effect of the RC time constant trim capacitor array C1cal from the amplifier 22. An advantage of removing the RC time constant trim capacitor array C1cal in this manner is that it reduces the PN junction area (e.g., from MOSFETs used as switches in the trim capacitor array) attached to the virtual ground Vx of the first integrator INT1 which makes trim performance less susceptible to process/temperature/voltage variation.

Figure 15:
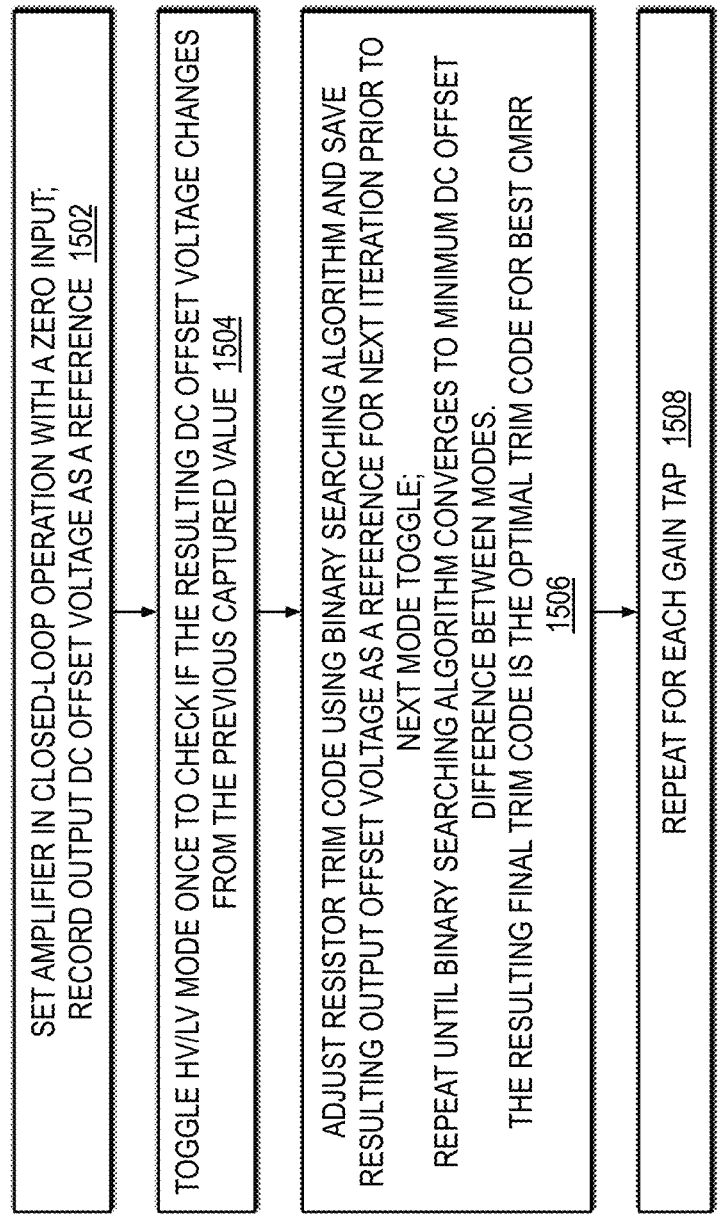
FIG. 15 is a flowchart illustrating a method for calibrating resistor ratios using the calibration circuit of FIG. 13.

Referring now to FIG. 15, a flowchart illustrating a method for calibrating resistor ratios using the calibration circuit 1302 of FIG. 13 is shown. Operation begins at block 1502.

At block 1502, the amplifier 22 is set for closed-loop operation with a zero input, and the output DC offset voltage is recorded as the reference. The operation proceeds to block 1504.

At block 1504, the HV/LV mode is toggled once to check if the resulting DC offset voltage changes from the previous captured value. The operation proceeds to block 1506.

At block 1506, the resistor trim code is adjusted using a binary searching algorithm and the resulting output offset voltage is saved as a reference for the next iteration prior to the next mode toggle. This step is repeated until the binary searching algorithm converges to a minimum DC offset difference between modes. The resulting final code is the optimal code to attain desirable CMRR. The operation proceeds to block 1508.

At block 1508, steps 1502 through 1506 are repeated for each gain tap. In this manner, the resistor ratio optimal trim code may be found.

The RC time constant trim is utilized to remove transient glitch originated from periodic common-mode toggle at the Class-D driver stage 34. Theoretically, only one calibration is required. Preferably, the whole trim code space is swept for the best code that yields minimum transient glitch. During the trim procedure, periodic mode toggle is enforced to expose a time constant difference between the differential p and m paths of the first integrator INT1, and spectrum analysis (e.g., Fast Fourier Transform (FFT)) may be used to evaluate in-band glitchy pulse energy with great resolution.

Glitch Free Transition Between Power Rails in Class-D Amplifier Incorporating Dual Path Power Rail Sensing To minimize power stage gain variation associated with supply voltage change, the gain of the quantizer set by the ramp amplitude must be made proportional to the supply voltage. Ideally, as the end stage supply moves, the duty cycle output from the quantizer moves accordingly. Thus, the amplifier feedback loop does not need to react as long as such supply feed-forward is made perfectly.

Unfortunately, the sensing network may have a limited bandwidth. The supply voltage feed-forward concept may only work to a certain frequency beyond which path latency is too large such that the DC operating point (DCOP) set by the power supply feed-forward path is imprecise. Therefore, the loop experiences a DCOP settling procedure, and this settling is the root cause of a power supply transient glitch. A more difficult situation exists when a sudden step transient takes place at the end stage supply, which calls for an immediate response to the ramp amplitude. Because no circuit has infinite bandwidth, embodiments are described in which a second path is incorporated to solve this situation.

Figure 16:
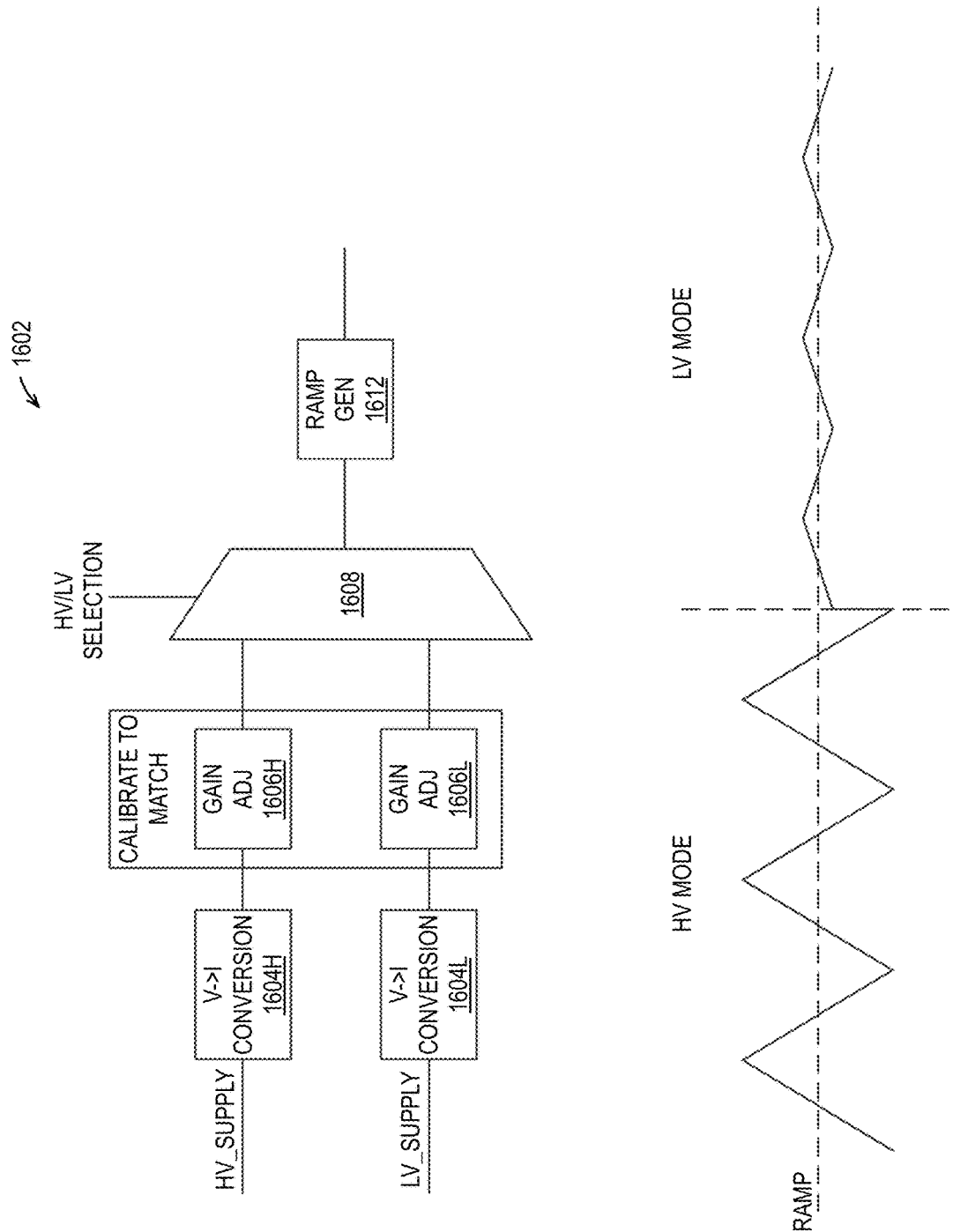
FIG. 16 is a conceptual block diagram of an embodiment of a dual supply sensing circuit for ramp generation illustrating the ability for ramp amplitude to move instantaneously with an operating mode change of output stage.

Referring now to FIG. 16, a conceptual block diagram of an embodiment of a dual supply sensing circuit 1602 for ramp generation illustrating the ability for ramp amplitude to move instantaneously with an operating mode change of output stage is shown. A first current-to-voltage conversion block 1604H converts the HV_SUPPLY to an HV current received by a first gain adjustment block 1606H. A second current-to-voltage conversion block 1604L converts the LV_SUPPLY to an LV current received by a second gain adjustment block 1606L. The first and/or second gain adjustment blocks 1606L and 1606H calibrate the received respective converted currents to match one another, which are provided to a multiplexer 1608. The multiplexer 1608 selects one of its inputs based on a control input HV/LV selection that indicates the present operating mode. The selected calibrated current is provided to a ramp generator 1612 that generates a ramp compared by a comparator of the quantizer 304 with the output of the loop filter 302, and the result is provided to the driver stage 34 to drive the load 332.

As may be conceptualized from FIG. 16, there is through the quantizer 304 a HV path and a LV path. The HV path is used by the quantizer 304 in HV mode and the LV path is used by the quantizer 304 in LV mode. The HV path of the quantizer 304 and the HV output stage 404 have a combined HV gain, and the LV path of the quantizer and the LV output stage 424 have a combined LV gain. The combined HV gain and combined LV gain are calibrated to match (e.g., to within several percent), so any change in the open loop transfer function of the speaker amplifier 22 is minimized when the operating mode is changed. Therefore, glitch associated with a change in the open loop transfer function caused by a difference between the combined HV gain and the combined LV gain may be minimized or eliminated. Furthermore, an optimal location for making an operating mode change to minimize possible impact of the combined HV gain and LV gain mismatch is when the output voltage of differential driver stage 34 is zero, which may be detected as a zero duty cycle crossing of the output of the quantizer 304. Hence a VZC detection circuit (e.g., a phase detector) based on local outputs of the quantizer 304 may be employed for timely detection.

Timing of supply switching is also critical to glitch free transition, as it must not disturb the current duty cycle generation. Thus, the best point to make a supply change is at a beginning of a PWM period that occurs at an instance when both terminals of the load 332 are connected to a power rail that is shared by both the HV output stage 404 and the LV output stage 424, as shown in the lower portion of FIG. 16 as the transition is made at a trough of the ramp, which corresponds to a CEM start pulse that initiates a PWM period. Advantageously, making a supply change at a beginning of a PWM period that occurs at an instance when both terminals of the load 332 are connected to a power rail that is shared by both the HV output stage 404 and the LV output stage 424 may be precisely coordinated in a single chip design.

Figure 17:
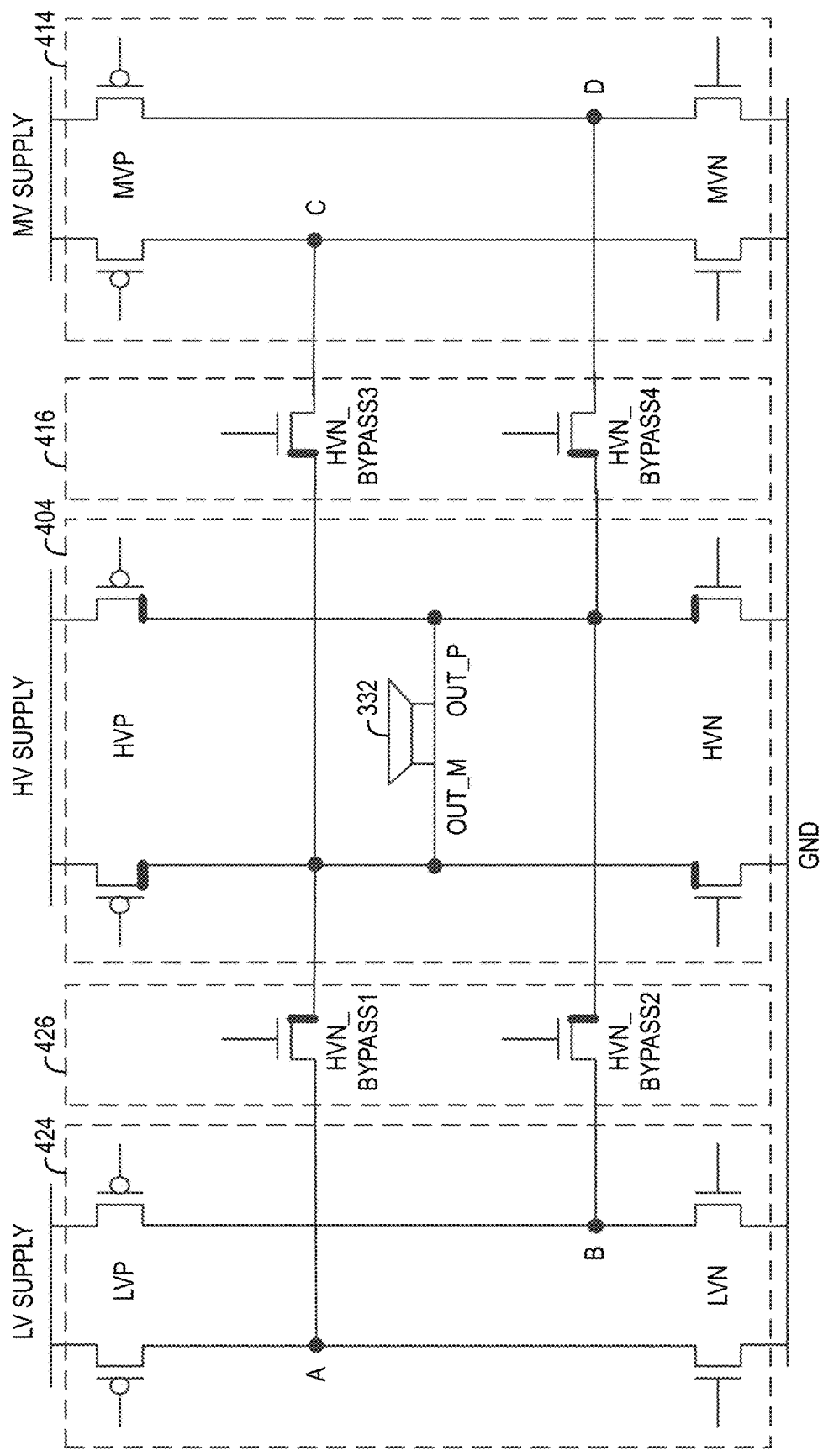
FIG. 17 is a circuit diagram illustrating an embodiment of the driver stage of FIG. 3 having a triple output stage.

Referring now to FIG. 17, a circuit diagram illustrating an embodiment of the driver stage 34 of FIG. 3 having a triple output stage is shown. The embodiment of FIG. 17 is similar to the embodiment of FIG. 5 in many respects and like-numbered elements are similar. However, the embodiment of FIG. 17 also includes examples of the MV output stage 414 and the bypass and HV block circuit 416 of FIG. 4. The MV output stage 414 includes an MVP portion and an MVN portion. The MVP portion includes a pair of p-channel MV FETs (MVP) whose sources are coupled to MV_SUPPLY. The drain of one of the MV p-channel FETs (MVP) is coupled to the bypass and HV block circuit 416 via a node C, and the drain of the other of the medium voltage p-channel FETs (MVP) is coupled to the bypass and HV block circuit 416 via a node D. The MVN portion includes a pair of n-channel MV FETs (MVN) whose sources are coupled to ground. The drain of one of the n-channel MV FETs (MVN) is coupled to the bypass and HV block circuit 416 via node C and the drain of the other of the n-channel medium voltage FETs (MVN) is coupled to the bypass and HV block circuit 416 via node D. The gates of the MVP and MVN FETs may be driven by an MV pre-driver (e.g., MV pre-driver 412 of FIG. 4) with a differential PWM signal, and the gates of the MVP and MVN FETs may be driven by an MV pre-driver (e.g., MV pre-driver 412 of FIG. 4) with a differential PWM signal. When the Class-D amplifier 22 is in MV mode, the HVP and HVN (as well as the associated HV pre-driver 402) and the LVP and LVN (as well as the associated LV pre-driver 422) are turned off in order to substantially reduce power dissipation.

Although not shown in FIG. 17, the bypass and HV block circuit 416 includes a third clamp, a third capacitor and a third buffer, each coupled between node C and a floating voltage at the cathode of a diode whose anode is coupled to a supply voltage node (e.g., battery) in a manner similar to that shown in FIG. 5 for the bypass and HV block circuit 426. The third buffer output is coupled to the gate of a third high-voltage n-channel FET HVN_bypass3 that operates as an interconnecting switch, or bypass switch, to selectively couple node C to node OUT_M. Although not shown, the bypass and HV block circuit 416 also includes a fourth clamp, a fourth capacitor and a fourth buffer, each coupled between node D and the floating voltage. The fourth buffer output is coupled to the gate of a fourth high-voltage n-channel FET HVN_bypass4 that operates as an interconnecting switch, or bypass switch, to selectively couple node D to node OUT_P. The bypass switches HVN_bypass3 and HVN_bypass4 also serve to protect the MVP and MVN FETs from the high voltage supplied through the HVP from the HV_SUPPLY when the HVP are turned on.

The MV output stage 414 is constructed under a different power domain and with different types of devices than the HV output stage 404 or the LV output stage 424. The bypass switches HVN_bypass3 and HVN_bypass4 (referred to collectively as bypass switches HVN_bypass) are of the HV type. When the bypass switches HVN_bypass are enabled, the MV output stage 414 is connected to the output load 332, and when the bypass switches HVN_bypass are disabled, they block the swing from the MV output stage 414 to the output load 332. The control of the bypass switches HVN_bypass is static, based on a power envelope detection of the output signal. The bypass switches HVN_bypass are powered by the local floating voltage supply. The floating voltage is created by a bootstrapping circuit similar to that described with respect to FIG. 5.

During a mode transition between the MV output stage 414 and one of the two other output stages (e.g., 404 and 424), a "make before break" rule is followed regardless of which direction the operating mode is transitioning, similar to that described above with respect to FIG. 6.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

The invention claimed is:

1. A method for improving a broadband common-mode-rejection-ratio (CMRR) in a Class-D amplifier, comprising:
   matching first and second ratios in a first trimming manner;
   wherein the Class-D amplifier includes an integrator coupled to differential first and second paths;
   wherein the first ratio is of a feedback resistor to an input resistor in the first path;
   wherein the second ratio is of a feedback resistor to an input resistor in the second path;
   matching first and second RC time constants in a second trimming manner, after said matching the first and second ratios in the first trimming manner;
   wherein an R of the first RC time constant is the resistors of the first matched ratio and a C of the first RC time constant is an integrating capacitor in the first path; and
   wherein another R of the second RC time constant is the resistors of the second matched ratio and another C of the second RC time constant is an integrating capacitor in the second path.

2. The method of claim 1,
   wherein the first trimming manner comprises trimming at least one resistor array in at least one of the first and second paths; and
   wherein the second trimming manner comprises trimming at least one capacitor array in at least one of the first and second paths.

3. The method of claim 2,
   wherein said matching the first and second ratios comprises trimming the at least one resistor array to alter an equivalent resistance of the input resistor and the at least one resistor array.

4. The method of claim 3,
   wherein the at least one resistor array is static with respect to a pulse width modulation (PWM) input signal that toggles the input resistors in the differential first and second paths.

5. The method of claim 2,
   wherein the at least one resistor array is coupled to a virtual ground of the integrator.

6. The method of claim 5, further comprising:
   wherein the at least one capacitor array comprises a first capacitor array in the first path and a second capacitor array in the second path;
   wherein the first and second capacitor arrays include switches used to trim according to the second manner;
   wherein the Class-D amplifier includes a first buffer in the first path and a second buffer in the second path each coupled to the virtual ground of the integrator; and
   operating one of the first and second buffers to create a zero potential across one of the first and second capacitor arrays to reduce PN junction area attached to the virtual ground of the integrator.

7. The method of claim 1,
   wherein the first trimming manner comprises using a laser to trim one or more of the feedback resistors and input resistors to match the first and second ratios; and
   wherein the second trimming manner comprises using a laser to trim one or more of the integrating capacitors to match the first and second RC time constants.

8. A Class-D amplifier, comprising:
   an integrator coupled to differential first and second paths;
   wherein the first and second paths each includes a feedback resistor, an input resistor, and an integrating capacitor;
   wherein a first ratio is of the feedback resistor to the input resistor in the first path, and a second ratio is of the feedback resistor to the input resistor in the second path;
   wherein the first and second ratios are matchable in a first trimming manner;
   wherein an R of a first RC time constant is the resistors of the first matched ratio and a C of the first RC time constant is the integrating capacitor in the first path, and another R of a second RC time constant is the resistors of the second matched ratio and another C of the second RC time constant is the integrating capacitor in the second path; and
   wherein the first and second RC time constants are matchable in a second trimming manner.

9. The Class-D amplifier of claim 8, further comprising:
   at least one resistor array in at least one of the first and second paths trimmable according to the first trimming manner; and
   at least one capacitor array in at least one of the first and second paths trimmable according to the second trimming manner.

10. The Class-D amplifier of claim 9,
    wherein the at least one resistor array is trimmable to alter an equivalent resistance of the input resistor and the at least one resistor array to match the first and second ratios.

11. The Class-D amplifier of claim 10,
    wherein the at least one resistor array is static with respect to a pulse width modulation (PWM) input signal that toggles the input resistors in the differential first and second paths.

12. The Class-D amplifier of claim 8,
    wherein the at least one resistor array is coupled to a virtual ground of the integrator.

13. The Class-D amplifier of claim 12, further comprising:
    wherein the at least one capacitor array comprises a first capacitor array in the first path and a second capacitor array in the second path;
    wherein the first and second capacitor arrays include switches used to trim according to the second manner;
    a first buffer in the first path and a second buffer in the second path each coupled to the virtual ground of the integrator; and
    wherein the first and second buffers are operable to create a zero potential across the first and second capacitor arrays to reduce PN junction area attached to the virtual ground of the integrator.

14. The Class-D amplifier of claim 8,
    wherein the first trimming manner comprises using a laser to trim one or more of the feedback resistors and input resistors to match the first and second ratios; and wherein the second trimming manner comprises using a laser to trim one or more of the integrating capacitors to match the first and second RC time constants.

* * * * *

UNITED STATES PATENT AND TRADEMARK OFFICE
CERTIFICATE OF CORRECTION

PATENT NO. : 10,862,442 B2
APPLICATION NO. : 16/184909
DATED : December 8, 2020
INVENTOR(S) : Zhaohui He, Rahul Singh and Ruoxin Jiang Page 1 of 1

It is certified that error appears in the above-identified patent and that said Letters Patent is hereby corrected as shown below:

In the Claims

In Column 22, Line 47, in Claim 12, delete "claim 8" and insert -- claim 9 --, therefor.

Signed and Sealed this
Fifteenth Day of April, 2025

Coke Morgan Stewart
*Acting Director of the United States Patent and Trademark Office*